United States Patent
Horikiri et al.

(10) Patent No.: US 11,732,380 B2
(45) Date of Patent: Aug. 22, 2023

(54) NITRIDE CRYSTAL SUBSTRATE AND METHOD FOR MANUFACTURING THE SAME

(71) Applicant: SUMITOMO CHEMICAL COMPANY, LIMITED, Tokyo (JP)

(72) Inventors: Fumimasa Horikiri, Ibaraki (JP); Takeshi Kimura, Ibaraki (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 106 days.

(21) Appl. No.: 16/410,224

(22) Filed: May 13, 2019

(65) Prior Publication Data

US 2020/0040482 A1 Feb. 6, 2020

(30) Foreign Application Priority Data

May 16, 2018 (JP) .............. JP2018-094775

(51) Int. Cl.
*C30B 29/38* (2006.01)
*C30B 33/00* (2006.01)
*C30B 25/18* (2006.01)

(52) U.S. Cl.
CPC .............. *C30B 29/38* (2013.01); *C30B 25/18* (2013.01); *C30B 33/00* (2013.01)

(58) Field of Classification Search
CPC ......... C30B 25/00; C30B 25/02; C30B 25/04; C30B 25/16; C30B 25/165; C30B 25/18; C30B 25/186; C30B 33/00; C23C 16/22; C23C 16/30; C23C 16/301; C23C 16/303; C23C 16/44; C23C 16/4401; C23C 16/4404

USPC .... 117/84–86, 88–90, 93–95, 102, 105, 937, 117/952; 252/62.3 GA
See application file for complete search history.

(56) References Cited

U.S. PATENT DOCUMENTS

| | | | |
|---|---|---|---|
| 6,001,748 A | 12/1999 | Tanaka et al. | |
| 2006/0226414 A1* | 10/2006 | Oshima | H01L 21/02664 257/11 |

(Continued)

FOREIGN PATENT DOCUMENTS

| | | |
|---|---|---|
| CN | 107532326 A | 1/2018 |
| JP | 2007-126320 A | 5/2007 |

(Continued)

OTHER PUBLICATIONS

Barker, A. S., et al., "Infrared Lattice Vibrations and Free-Electron Dispersion in GaN", Physical Review B, Jan. 15, 1973, pp. 743-750, vol. 7, No. 2.

(Continued)

*Primary Examiner* — Erica S Lin
(74) *Attorney, Agent, or Firm* — Pearne & Gordon LLP

(57) ABSTRACT

There is provided a nitride crystal substrate having a main surface and formed of group-III nitride crystal, wherein $N_{IR}/N_{Elec}$, satisfies formula (1) below, which is a ratio of a carrier concentration $N_{IR}$ at a center of the main surface relative to a carrier concentration $N_{Elec}$: $0.5 \leq N_{IR}/N_{Elec} \leq 1.5$ ... (1) where $N_{IR}$ is the carrier concentration on the main surface side of the nitride crystal substrate obtained based on a reflectance of the main surface measured by a reflection type Fourier transform infrared spectroscopy, and $N_{Elec}$ is the carrier concentration in the nitride crystal substrate obtained based on a specific resistance of the nitride crystal substrate and a mobility of the nitride crystal substrate measured by an eddy current method.

13 Claims, 16 Drawing Sheets

(56) References Cited

U.S. PATENT DOCUMENTS

| | | | |
|---|---|---|---|
| 2007/0096147 A1 | 5/2007 | Oshima | |
| 2008/0042160 A1 | 2/2008 | Shibata | |
| 2009/0127662 A1 | 5/2009 | Okahisa et al. | |
| 2011/0117681 A1 | 5/2011 | Bardos et al. | |
| 2011/0175200 A1 | 7/2011 | Yoshida | |
| 2018/0073164 A1 | 3/2018 | Goto et al. | |
| 2018/0195206 A1* | 7/2018 | Jiang | C30B 7/105 |

FOREIGN PATENT DOCUMENTS

| | | |
|---|---|---|
| JP | 2008-1344818 A | 2/2008 |
| JP | 2009-126722 A | 6/2009 |
| JP | 2011-148655 A | 8/2011 |
| JP | 2011-527510 A | 10/2011 |
| JP | 2015-146406 A | 8/2015 |

OTHER PUBLICATIONS

Perlin, P., et al., "Towards the Identification of the Dominant Donor in GaN", Physical Review Letters, Jul. 10, 1995, pp. 296-299, vol. 75, No. 2.

Bentoumi, G., et al. "Influence of Si doping level on the Raman and IR reflectivity spectra and optical absorption spectrum of GaN", Materials Science and Engineering B50 (1997) pp. 142-147.

Porowski, Sylwester, "Bulk and homoepitaxial GaN-growth and characterisation", Journal of Crystal Growth 189/190 (1998) pp. 153-158.

Van De Walle, Chris G., "Effects of impurities on the lattice parameters of GaN", Physical Review B 68, 165209-1-5 (2003).

Polyakov, A. Y., et al., "Hydride vapor phase GaN films with reduced density of residual electrons and deep traps", AIP Journal of Applied Physics, 115, 183706-1-6 (2014).

Chinese Office Action dated Jan. 17, 2022 issued in Chinese Patent Application No. 201910399256.7.

Zhang et. al., "Measuring the carrier concentration and mobility of GaN film with infrared spectrum," Physics Experimentation, vol. 33, No. 3, Mar. 31, 2013 (English abstract at the end of the document).

Semiconductor Material Technology, p. 183, paragraph 2, Eds. Dhai et al., Shenjiangt Scientific Press, Feb. 28, 2010.

"Technical Info," web page <https://www.napson.co.jp/technique> from Napson Corporation web page downloaded on Jan. 21, 2022.

Wide Bandgap Semiconductor and Microwave Power Devices with Circuits, National Defense Industry Press, p. 41, second paragraph, Dec. 2017.

* cited by examiner

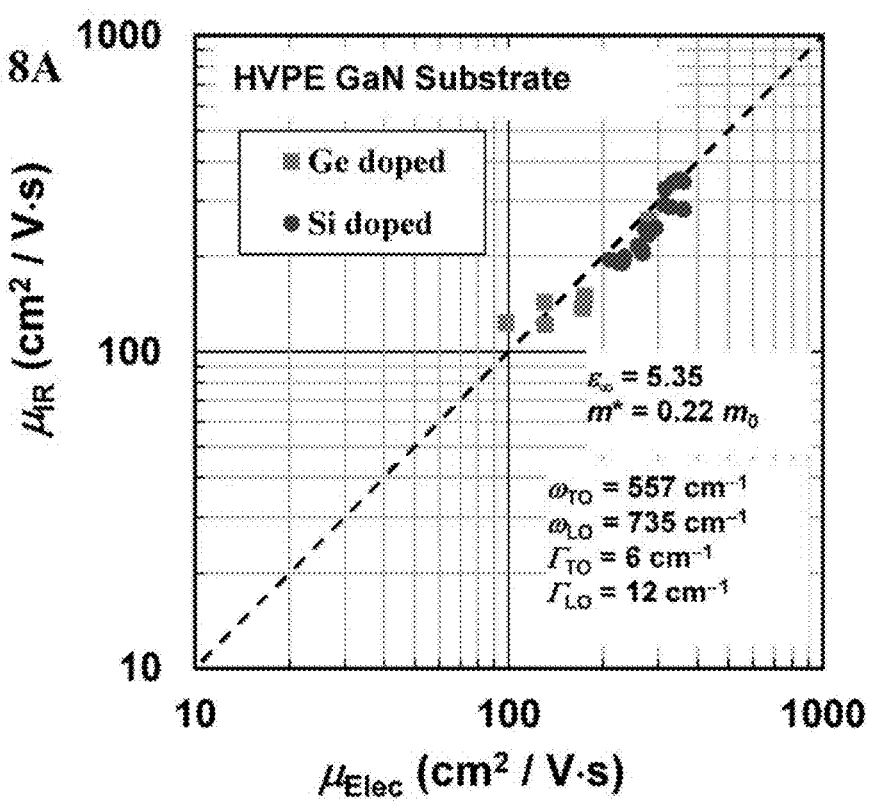
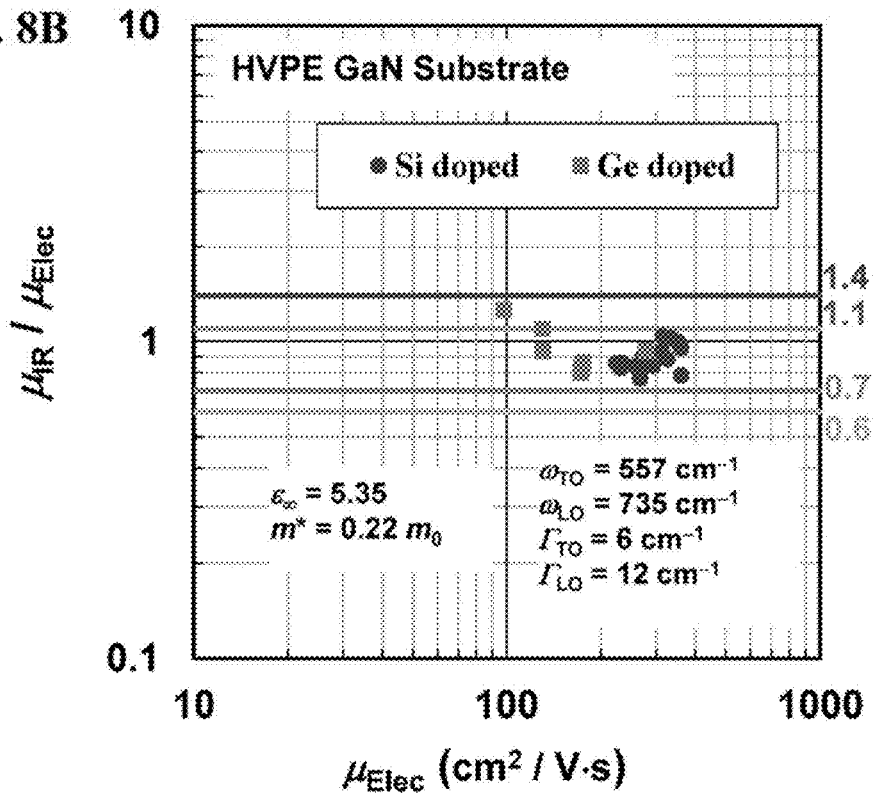

NITRIDE CRYSTAL SUBSTRATE AND METHOD FOR MANUFACTURING THE SAME

BACKGROUND

Technical Field

The present invention relates to a nitride crystal substrate and a method for manufacturing the nitride crystal substrate.

Description of Related Art

A group-III nitride has been widely used as a material forming a semiconductor device such as an optical device or an electronic device. For example, a semiconductor laminate having a semiconductor layer epitaxially grown on a nitride crystal substrate is subjected to dicing to thereby be cut into a plurality of semiconductor devices (see, for example, Patent Document 1).
[Patent Document 1] Japanese Unexamined Patent Publication No. 2015-146406

Variation of a carrier concentration or a mobility in a nitride crystal substrate may possibly lead to variation of device properties among semiconductor devices cut from the substrate.

An object of the present invention is to provide a technology to attain approximately uniform distribution of at least one of a carrier concentration and a mobility in a nitride crystal substrate.

Means for Solving the Problem

According to an aspect of the present invention, there is provided a nitride crystal substrate having a main surface and formed of group-III nitride crystal,
wherein $N_{IR}/N_{Elec}$ satisfies formula (1) below, which is a ratio of a carrier concentration $N_{IR}$ at a center of the main surface to a carrier concentration $N_{Elec}$:

$$0.5 \leq N_{IR}/N_{Elec} \leq 1.5 \quad (1)$$

where, $N_{IR}$ is the carrier concentration on the main surface side of the nitride crystal substrate obtained based on a reflectance of the main surface measured by a reflection type Fourier transform infrared spectroscopy, and $N_{Elec}$ is the carrier concentration in the nitride crystal substrate obtained based on a specific resistance of the nitride crystal substrate and a mobility of the nitride crystal substrate measured by an eddy current method.

According to another aspect of the present invention, there is provided a nitride crystal substrate having a main surface and formed of group-III nitride crystal,
wherein a ratio $\mu_{IR}/\mu_{Elec}$ satisfies formula (2) below, which is a ratio of a mobility IR at the center of the main surface relative to a mobility $\mu_{Elec}$:

$$0.6 \leq \mu_{IR}/\mu_{Elec} \leq 1.4 \quad (2)$$

where $\mu_{IR}$ is the mobility on the main surface side of the nitride crystal substrate obtained based on the reflectance of the main surface measured by the reflection-type Fourier-transform infrared spectroscopy and
$\mu_{Elec}$ is the mobility of the nitride crystal substrate measured by an eddy current method.

According to still another aspect of the present invention, there is provided a method for manufacturing a nitride crystal substrate comprising:

forming a crystal layer formed of group-III nitride crystal containing a predetermined conductive type impurity on a base substrate; and
slicing the crystal layer to fabricate the nitride crystal substrate;
wherein, in the formation of the crystal layer,
a carrier concentration on a crystal growth surface side of the crystal layer is measured by an optical measurement, and an addition amount of the conductive type impurity is feedback controlled according to the carrier concentration on the crystal growth surface side.

According to still another aspect of the present invention, there is provided a method for manufacturing a nitride crystal substrate comprising:

forming a crystal layer formed of group-III nitride crystal containing a predetermined conductive type impurity on a base substrate; and
slicing the crystal layer to fabricate the nitride crystal substrate;
wherein, in the formation of the crystal layer,
a mobility on a crystal growth surface side of the crystal layer is measured by an optical measurement, and an addition amount of the conductive type impurity is feedback controlled according to the mobility on the crystal growth surface side.

Advantage of the Invention

According to the present invention, an approximately uniform distribution of at least one of a carrier concentration and a mobility in a nitride crystal substrate can be attained.

BRIEF DESCRIPTION OF THE DRAWINGS

FIG. 8A is a diagram illustrating a relation of a mobility $\mu_{IR}$ in the nitride crystal substrate 10 obtained based on the reflectance of a main surface measured by the reflection-type FTIR method to a mobility $\mu_{Elec}$ in the nitride crystal substrate 10 obtained by the electrical measurement.

FIG. 8B is a diagram illustrating a relation of a mobility ratio $\mu_{IR}/\mu_{Elec}$ to a mobility $\mu_{Elec}$ in the nitride crystal substrate 10 obtained by the electrical measurement.

DETAILED DESCRIPTION OF THE INVENTION

<Findings of the Inventors>

First, the findings by the inventors will be explained.
(1) Carrier Concentration Distribution in Nitride Crystal Substrate As a method for manufacturing a nitride crystal substrate, there is a known method such as a VAS (Void-Assisted Separation) method. In a nitride crystal substrate manufactured by the conventional VAS method, carrier concentrations in the nitride crystal substrate may possibly distribute approximately concentrically from a center side toward an outer side in a radial direction of a main surface due to a warpage generated in a crystal layer in a manufacturing step. The reasons will be hereinafter explained.

Figure 13A:
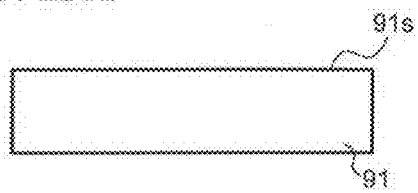
FIG. 13A to FIG. 13G are schematic cross-sectional diagrams illustrating a method for manufacturing a nitride crystal substrate 90 according to a comparative example.
Figure 13B:
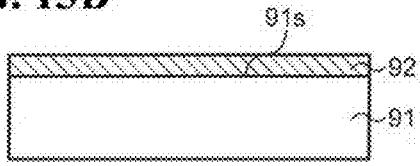
Figure 13C:
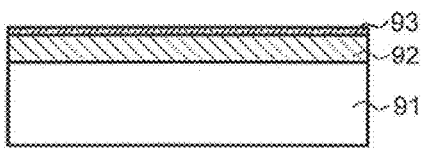
Figure 13D:
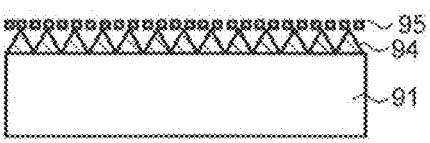
Figure 13E:
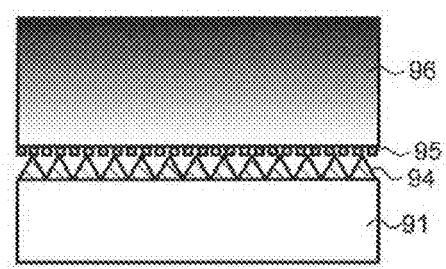
Figure 13F:
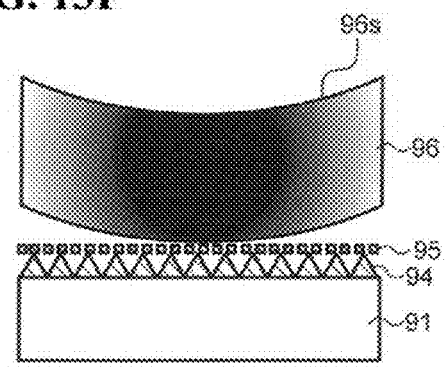
Figure 13G:
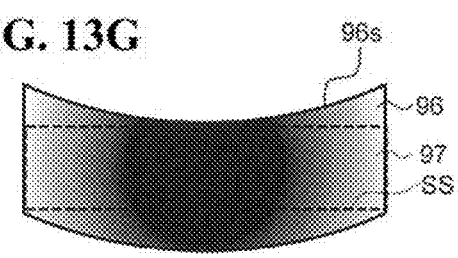

Using FIG. 13A to FIG. 13G, a method for manufacturing a nitride crystal substrate 90 of a comparative example will be explained. FIG. 13A to FIG. 13G are schematic cross-sectional diagrams illustrating the method for manufacturing the nitride crystal substrate 90 according to the comparative example. FIG. 13E to FIG. 13G indicate that the darker the second crystal layer 96, the higher the carrier concentration. The nitride crystal substrate 90 is hereinafter abbreviated as a "substrate 90".

As illustrated in FIG. 13A to FIG. 13D, a base substrate 91 (hereinafter abbreviated as a "substrate 91") having a main surface 91s which is to be a crystal growth surface is firstly prepared. After the substrate 91 is prepared, a first crystal layer 92 is grown on the main surface 91s of the substrate 91 by a metal organic chemical vapor deposition (MOVPE) method. After the first crystal layer 92 is grown, a metal layer 93 is deposited on the first crystal layer 92. After the metal layer 93 is deposited, a heat treatment is performed in an atmosphere, for example, containing hydrogen ($H_2$) gas and ammonia ($NH_3$) gas. Accordingly, the metal layer 93 is nitrided to form a metal nitride layer 95 having fine pores on the surface thereof. The first crystal layer 92 is partially etched through the pores in the metal nitride layer 95 to form high-density voids in the first crystal layer 92. Thus, a void-containing first crystal layer 94 is formed.

Next, as illustrated in FIG. 13E, a second crystal layer 96 containing a predetermined conductive type impurity is grown on the void-containing first crystal layer 94 and the metal nitride layer 95 by a hydride vapor phase epitaxy (HVPE) method.

At this time, a film forming gas is supplied, for example, by a so-called side flow from a direction parallel to the main surface. In a case of the side flow, for example, a growth rate tends to be relatively higher in an initial stage and a middle stage of a crystal growth process, whereas the growth rate tends to decrease in a final stage of the crystal growth process. One of the reasons is considered that the crystal growth surface gradually shifts higher relative to a gas channel as the crystal growth proceeds.

An addition amount of the conductive impurity tends to decrease when the crystal growth rate is high, and to increase when the crystal growth rate is low. Therefore, when the growth rate decreases as the crystal growth proceeds, the impurity concentration in the second crystal layer 96 gradually increases from bottom to top in the thickness direction of the second crystal layer 96. In other words, the impurity concentration in the second crystal layer 96 becomes to have a distribution varying gradationally in the thickness direction. In this stage, however, the impurity concentration is uniform in an in-plane direction of the crystal growth surface of the second crystal layer 96.

At this time, some voids in the void-containing first crystal layer 94 are embedded by the second crystal layer 96, while other voids in the void-containing first crystal layer 94 remain. A flat gap is formed between the second crystal layer 96 and the metal nitride layer 95 due to voids that remain in the void-containing first crystal layer 94. Such a gap will cause the second crystal layer 6 to peel.

At this time, tensile stress is introduced in the second crystal layer 96, due to an attraction between island-like initial nuclei in the growth process of the second crystal layer 96. Moreover, a dislocation density of the second crystal layer 96 decreases gradually in the thickness direction, since dislocation is bent in a process in which the initial nucleus is grown in a transverse direction.

After completion of the growth of the second crystal layer 6, the second crystal layer 96 spontaneously peels from the substrate 91 at the boundary of the void-containing first crystal layer 94 and the metal nitride layer 95 in a cooling process.

At this time, tensile stress is introduced in the second crystal layer 96 as described above. In addition, there is a difference of a dislocation density generated in the thickness direction in the second crystal layer 96 as described above. Accordingly, the internal stress acts on the second crystal layer 96 so that the main surface 96s side thereof is concave.

As a result, as illustrated in FIG. 13F, the second crystal layer 96 is warped so that the main surface 96s side thereof becomes concave after peeled from the substrate 91. Accordingly, the impurity concentration distribution varying gradationally in the thickness direction in the second crystal layer 96 is warped (curved) so that the center of the main surface 96s of the second crystal layer 96 is concave. Further, the main surface 96s of the second crystal layer 96 which has had a uniform impurity concentration will be warped so that the center thereof is concave.

Next, as illustrated in FIG. 13G, the second crystal layer 6 is sliced at a cutting plane SS approximately perpendicular to a normal direction at the center of the main surface 96s of the second crystal layer 96. Thereby, a substrate 90 of the comparative example is obtained.

Figure 14A:
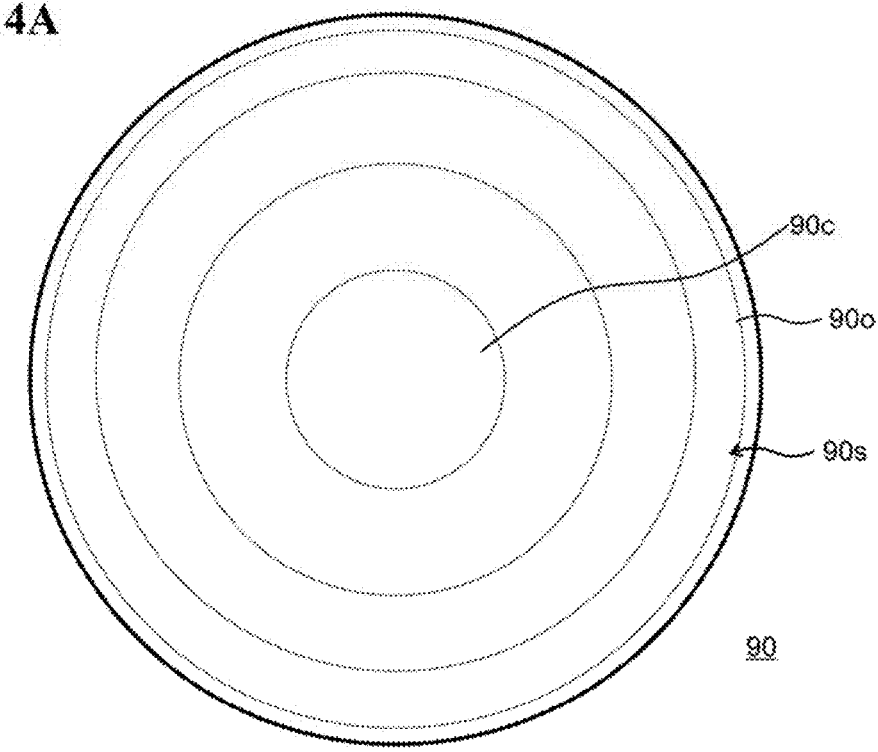
FIG. 14A is a schematic plan diagram illustrating the nitride crystal substrate 90 according to the comparative example.
Figure 14B:
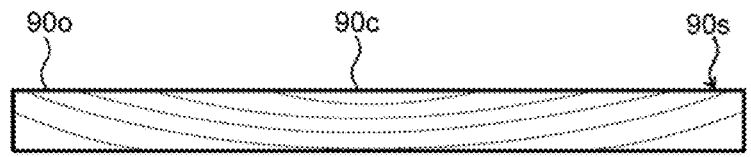
FIG. 14B is a schematic cross sectional diagram illustrating the nitride crystal substrate 90 according to the comparative example.

Now, the substrate 90 of the comparative example will be explained using FIGS. 14A and 14B. FIG. 14A is a schematic plan diagram illustrating the nitride crystal substrate 90 according to the comparative example, and FIG. 14B is a schematic cross-sectional diagram illustrating the nitride crystal substrate 90 according to the comparative example. In FIGS. 14A and 14B, a dotted line indicates isoconcentration line of carrier.

The impurity concentration distribution varying gradationally in the thickness direction in the second crystal layer 96 is warped. Therefore, when the second crystal layer 96 is sliced, the conductive type impurity concentration in the resulting substrate 90 of the comparative example, as illustrated in FIG. 14A, distributes approximately concentrically from the center side toward the outer side in the radial direction of the main surface 90s in a plane view. Accordingly, the carrier concentration in the substrate 90 of the comparative example distributes approximately concentrically from the center side toward the outer side in the radial direction of the main surface 90s in a plane view. For example, the carrier concentration is higher in a center side region 90c of the main surface 90s of the substrate 90 and the carrier concentration is lower in an outer peripheral side region 90o surrounding the center side region 90c of the main surface 90s of the substrate 90.

As illustrated in FIG. 14B, the carrier concentration in the substrate 90 of the comparative example distributes approximately concentrically from the center side toward the outer side of the main surface 90s in a sectional view as well. The carrier concentration is higher on the center side of the main surface 90s of the substrate 90 and is lower on the back surface side of the substrate 90.

When the substrate 90 in which the carrier concentration distributes approximately concentrically as described above is cut into a plurality of semiconductor devices, device properties are possibly varied among the plurality of semiconductor devices. Moreover, when the substrate 90 has the carrier concentration distribution in the thickness direction, the carrier concentration is possibly different among the plurality of the substrates 90 obtained from the second crystal layer 96.

(2) Carrier Concentration Obtained by the FTIR Method

In the field of semiconductors, the carrier concentration in the semiconductor is obtained based on a reflectance of the main surface measured by the reflection-type Fourier Transform Infrared Spectroscopy (FTIR) method in some cases. Hereinafter, the carrier concentration obtained based on the reflectance of the main surface measured by the FTIR method is also referred to as a "carrier concentration obtained by the FTIR method". In this method, since light reflection occurs near the main surface of the semiconductor, which is a surface to be measured, the carrier concentration near the main surface of the semiconductor can be obtained.

In a nitride crystal substrate manufactured by a conventional manufacturing method, however, a carrier concentration cannot be obtained with high accuracy based on the reflectance of the main surface measured by the reflection-type FTIR method because of the following two reasons.

(i) Variation of Absorption Coefficient

When the nitride crystal substrate is irradiated with infrared light, an absorption (free carrier absorption) may be caused by a free carrier. An absorption coefficient of a free carrier absorption tends to monotonically increase in relation to a carrier concentration.

However, a nitride crystal substrate manufactured by a conventional manufacturing method other than the VAS method has a significant crystal strain and a high dislocation density. Therefore, in the conventional nitride crystal substrate, a dislocation scattering occurs, and due to such dislocation scattering, the absorption coefficient is excessively increased or varied. Further, oxygen (O) and an impurity other than the conductive type impurity are unintentionally incorporated in the conventional nitride crystal substrate, and due to such impurities, the absorption coefficient is excessively increased or varied.

When the absorption coefficient is excessively increased or varied, extinction coefficient k described later will be excessively increase or varied. Accordingly, in the conventional nitride crystal substrate, the carrier concentration cannot be obtained with high accuracy based on the reflectance of the main surface measured by the reflection-type FTIR method, due to the variation of the extinction coefficient k.

(ii) Variation of the Carrier Concentration

In the nitride crystal substrate manufactured by the conventional manufacturing method, there are some cases that a carrier concentration is varied in a thickness direction. Specifically, for example, the carrier concentration in the nitride crystal substrate manufactured, for example, by the conventional VAS method distributes approximately concentrically in a sectional view as described above. It is predicted that use of the reflection-type FTIR method using a dielectric constant ε of formula (4) described later enables a non-destructive and non-contact measurement of the above concentric distribution of a carrier concentration. However, in the conventional nitride crystal substrate, dislocation scattering and non-uniform carrier concentration in the thickness direction led to a large damping term due to LO phonon. Therefore, the carrier concentration cannot be obtained with high accuracy.

(3) Comparison with Carrier Concentration Obtained by Electrical Measurement

In a field of semiconductors, a carrier concentration in a semiconductor may be sometimes obtained by the electrical measurement such as a hole measurement or a method described below. Accordingly, the carrier concentration averaged over the entire semiconductor in a thickness direction can be obtained. The carrier concentration on the main surface side of the semiconductor obtained by the FTIR method matches the carrier concentration obtained by the electrical measurement, unless no variation of the carrier concentration is generated in the semiconductor.

However, in the nitride crystal substrate manufactured by the conventional manufacturing method, the carrier concentration distributed in the thickness direction as described above. Accordingly, the carrier concentration on the main surface side of the substrate obtained by the FTIR method was different from the carrier concentration obtained by the electrical measurement.

In the nitride crystal substrate manufactured by the conventional manufacturing method, an accuracy in the carrier concentration on the main surface side of the substrate measured by the FTIR method was low due to the variation of the absorption coefficient and the variation of the carrier concentration generated as described above. Accordingly, the carrier concentration on the main surface side of the substrate obtained by the FTIR method was different from the carrier concentration obtained by the electrical measurement.

In view of the above-described findings (1) to (3), there has been a need for a technology of both improving the accuracy of the carrier concentration on the main surface side of the substrate measured by the FTIR method and attaining an approximately uniform distribution of the carrier concentration in the nitride crystal substrate by improving the crystal quality of the nitride crystal substrate. There has also been need for a similar technology for the mobility in the nitride crystal substrate.

The present invention is based on the above-described finding obtained by the inventors of the present invention.

An Embodiment of the Present Invention

Figure 1A:
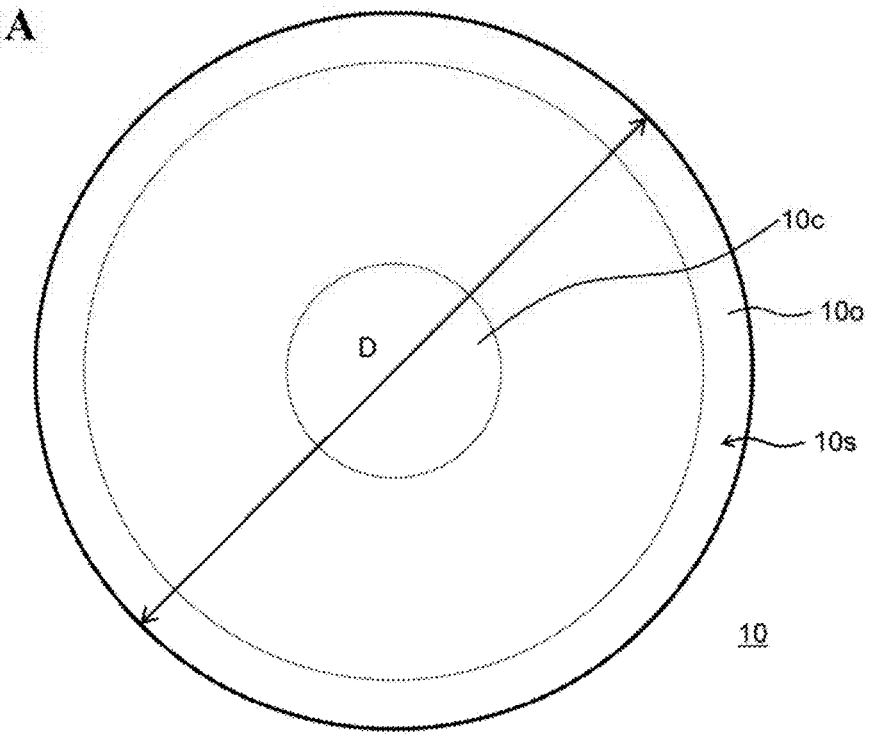
FIG. 1A is a schematic plan diagram illustrating a nitride crystal substrate 10 according to an embodiment of the present invention.
Figure 1B:
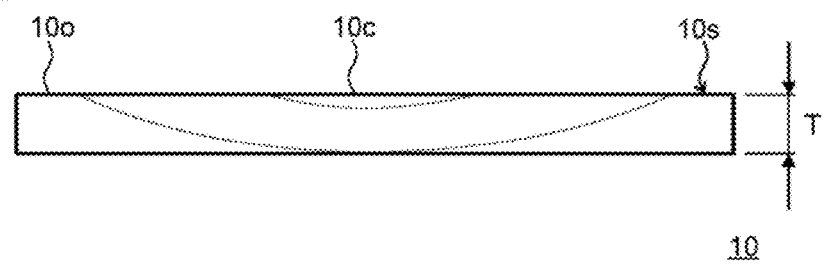
FIG. 1B is a schematic cross-sectional diagram illustrating a nitride crystal substrate 10 according to an embodiment of the present invention.

An embodiment of the present invention will be hereinafter explained with reference to drawings.
(1) Outline of Nitride Crystal Substrate Using FIG. 1A and FIG. 1B, a nitride crystal substrate 10 according to the present invention will be explained. FIG. 1A is a schematic plan diagram illustrating the nitride crystal substrate 10 according to this embodiment, and FIG. 1B is a schematic cross-sectional diagram illustrating the nitride crystal substrate 10 according to this embodiment. In FIGS. 1A and 1B, a dotted line indicates isoconcentration line of carrier.

Hereinafter, a main surface of the substrate or the like indicates primarily an upper-side main surface of the substrate or the like and may also be occasionally referred to as a front surface of the substrate. A back surface of the substrate or the like indicates a lower-side main surface of the substrate or the like.

As illustrated in FIG. 1A and FIG. 1B, the nitride crystal substrate 10 according to this embodiment (hereinafter also referred to as a substrate 10) is configured as a disc-like substrate used for manufacturing a semiconductor laminate or a semiconductor device. The substrate 10 is formed of group-III nitride single crystal, and in this embodiment, is formed of, for example, gallium nitride (GaN) single crystal.

The substrate 10 has a main surface 10s which is to be an epitaxial growth surface. The main surface of the substrate 10 is a so-called epi-ready surface, and a surface roughness (arithmetic average roughness, Ra) of the main surface 10s of the substrate 10 is, for example, 10 nm or less, and preferably 5 nm or less.

A diameter D of the substrate 10 is not particularly limited but, for example, 25 mm or more. With the substrate 10 having the diameter D of less than 25 mm, productivity of the semiconductor device is readily decreased. Accordingly, the diameter D of the substrate 10 is preferably 25 mm or more. The thickness T of the substrate 10 is, for example, 150 fpm or more and 2 mm or less. With the substrate 10 having thickness T of less than 150 μm, mechanical strength of the substrate 10 may be decreased and it may be difficult to maintain a free-standing state. Accordingly, the thickness T of the substrate 10 is preferably 150 μm or more. Here, the diameter D of the substrate 10 is 2 inches and the thickness T of the substrate 10 is 400 μm.

In this embodiment, a low-index crystal plane which is the closest to the main surface 10s of the substrate 10 is, for example, a (0001) plane (+c-plane, Ga polar plane). Hereafter, the (0001) plane is referred to as a c-plane.

In this embodiment, the c-plane as a low-index crystal plane which is the closest to the main surface 10s of the substrate 10 is, for example, curved in a concave spherical shape to the surface 10s due to a method for manufacturing the substrate 10 described later. The term "spherical" used herein means a curved shape that is spherically approximated. The phrase "spherically approximated" used herein means that approximation is within a predetermined error range with respect to a perfect circular sphere or an elliptic sphere.

In this embodiment, since the c-plane of the substrate 10 is curved in a concave spherical shape as described above, at least a part of the c-axes (<0001> axes) is inclined relative to a normal line of the main surface 10s. An "off angle", which is an angle formed between the c-axis and the normal line of the main surface 10s, has a predetermined distribution in the main surface 10s. For example, the off angle of the substrate 10 may be approximately expressed by a linear formula of a distance from the center toward the radial direction of the main surface 10s of the substrate 10. At an arbitrary position in the main surface 10s, an error of an actually measured off angle relative to an off angle obtained from the linear formula is, for example, within ±0.12°, preferably within ±0.06°, more preferably within ±0.02°. Moreover, a magnitude of the off angle (off amount) of the substrate 10 is, for example, 0° or more and 1.2° or less.

The substrate 10 contains a conductive type impurity. Accordingly, a predetermined concentration of a free carrier is generated in the substrate 10. In this embodiment, the substrate 10 contains, for example, at least one of silicon (Si) and germanium (Ge) as a n-type impurity (donor). Since a n-type impurity is doped in the substrate 10, a predetermined concentration of a free electron is generated in the substrate 10.

(2) Crystal Quality of Nitride Crystal Substrate

In this embodiment, since the crystal quality of the substrate 10 is good, the substrate 10 is configured so that the carrier concentration $N_{IR}$ and the mobility $\mu_{IR}$ on the main surface 10s side can be measured, for example, based on the reflectance of the main surface 10s measured by the reflection-type FTIR method.

Specifically, the substrate 10 satisfies the requirements relating to at least one of the following crystal qualities.
(Dislocation Density)

In this embodiment, since the substrate 10 is manufactured by the VAS method described later, the crystal strain in the substrate 10 is reduced, and the dislocation density in the main surface 10s of the substrate 10 is, for example, $5 \times 10^6/cm^2$ or less.

In the substrate 10 having the dislocation density in the main surface 10s is more than $5 \times 10^6/cm^2$, a dislocation scattering occurs, which may possibly lead to an excessively increased or varied absorption coefficient. Further, in the substrate 10 having the dislocation density in the main surface 10s of more than $5 \times 10^6/cm^2$, the local withstand voltage in a semiconductor layer formed on the substrate 10 may be possibly decreased. In contrast, since the dislocation density in the main surface 10s of the substrate 10 is $5 \times 10^6/cm^2$ or less as in this embodiment, the impact inflicted by the dislocation scattering can be reduced, thereby suppressing the excessive increase or variation in the absorption coefficient. In addition, since the dislocation density in the main surface 10s of the substrate 10 is $5 \times 10^6/cm^2$ or less, the decrease of the local withstand voltage in the semiconductor layer formed on the substrate 10 can be suppressed.

Because of the reduced crystal strain in the substrate 10, there is no crack in the substrate 10. Therefore, the substrate 10 can be stably used as a substrate for manufacturing a semiconductor device.

(Impurity Concentration)

In this embodiment, the substrate 10 is manufactured by the manufacturing method described below. Accordingly, among Si, Ge, and O which are used as n-type impurities, the concentration of O, whose addition amount is relatively difficult to control, is minimized, and the n-type impurity concentration in the substrate 10 is determined based on the total concentration of Si and Ge, whose addition amount is relatively easy to control.

In other words, the concentration of O in the substrate 10 is negligibly low, for example, 1/10 or less compared to the total concentration of Si and Ge in the substrate 10. Specifically, for example, the concentration of O in the substrate 10 is less than $1 \times 10^{17}$ at·cm$^{-3}$, while the total concentration of Si and Ge in the substrate 10 is $1 \times 10^{18}$ at·cm$^{-3}$ or more and $1.0 \times 10^{19}$ at·cm$^{-3}$ or less. Therefore, the concentration of the n-type impurity in the substrate 10 can be controlled by the total concentration of Si and Ge, whose addition amount is relatively easy to control. As a result, the free-electron concentration $N_e$ in the substrate 10 can be controlled so as to be equal to the total concentration of Si and Ge in the substrate 10 with high accuracy.

In addition, since the substrate 10 is manufactured by the manufacturing method described below, the concentration of an impurity other than the n-type impurities in the substrate 10 is negligibly low, for example, 1/10 or less compared to the concentration of n-type impurities (that is, the total concentration of Si and Ge) in the substrate 10. Specifically, for example, the concentration of the impurity other than the n-type impurity in the substrate 10 is less than $1 \times 10^{17}$ at·cm$^{-3}$. Accordingly, an inhibiting factor against the generation of a free electron from the n-type impurity can be reduced. As a result, the free-electron concentration $N_e$ in the substrate 10 can be controlled so as to be equal to the concentration of the n-type impurity in the substrate 10 with high accuracy.

The inventors of the present invention confirm that the concentration of each element in the substrate 10 can be stably controlled so as to satisfy the above-described requirements since a manufacturing method described below is employed.

According to the manufacturing method described below, it is recognized that each concentration of O and carbon (C) in the substrate 10 can be reduced to less than $5 \times 10^{15}$ at·cm$^{-3}$. It is also recognized that each of the concentrations of iron (Fe), chromium (Cr), boron (B) and the like in the substrate 10 can be reduced to less than $1 \times 10^{15}$ at·cm$^{-3}$. It is also recognized that the present method can reduce the concentration of other elements to the extent less than the lower limit of detection in the measurement by the Secondary Ion Mass Spectrometry (SIMS) method.

(Absorption Coefficient)

In this embodiment, the substrate 10 satisfies a predetermined requirement on the absorption coefficient in the infrared region, for example, based on the free carrier absorption of the substrate 10. Details will be described below.

Figure 2:
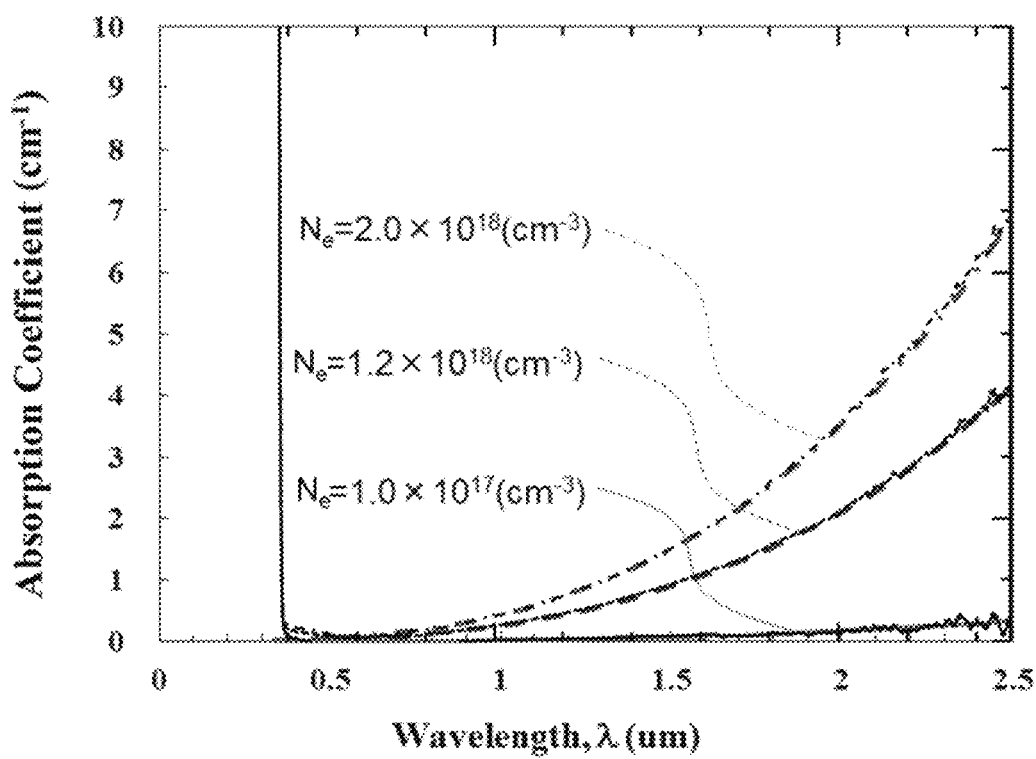
FIG. 2 is a diagram illustrating a free-electron concentration dependence of an absorption coefficient which is measured at room temperature (27° C.) in GaN-crystal manufactured by a manufacturing method according to an embodiment of the present invention.

FIG. 2 is a diagram illustrating a free-electron concentration dependence of the absorption coefficient which is measured at room temperature (27° C.) in the GaN-crystal manufactured by the manufacturing method according to this embodiment. FIG. 2 illustrates measurement results of the substrate formed of the GaN-crystal manufactured by the manufacturing method described below with Si-doping. In FIG. 2, a horizontal axis represents a wavelength (nm), while a vertical axis represents absorption coefficient α (cm$^{-1}$) of the GaN-crystal. The free-electron concentration in the GaN-crystal is indicated as $N_e$, and the absorption coefficient ac of the GaN-crystal is plotted for each of the predetermined free-electron concentration $N_e$, The free-electron concentration $N_e$ used herein is a value obtained by the electrical measurement.

As illustrated in FIG. 2, in the GaN-crystal manufactured by the manufacturing method described below, the absorption coefficient α in the GaN-crystal in a wavelength range of at least 1 μm or more and 3.3 μm or less tends to increase (monotonically increase) toward the longer wavelength resulting from the free carrier absorption. Moreover, the free carrier absorption in the GaN-crystal tends to increase as the free-electron concentration $N_e$ in the GaN-crystal increases.

Since the substrate 10 of this embodiment is formed of the GaN-crystal manufactured by the manufacturing method described below, the substrate 10 of this embodiment has small crystal strain, and almost free from O and the impurity other than the n-type impurity (for example, the impurity for compensating the n-type impurity), as described above. Accordingly, the substrate 10 of this embodiment exhibits a free-electron concentration dependence of the absorption coefficient as illustrated in FIG. 2. As a result, in the substrate 10 of this embodiment, the absorption coefficient in the infrared region can be approximated as a function with a free carrier concentration and a wavelength, as described below.

Specifically, the absorption coefficient α within a wavelength range of at least 1 μm or more and 3.3 μm or less (preferably 1 μm or more and 2.5 μm or less) in the substrate 10 of this embodiment is approximated by formula (3):

$$\alpha = N_e K \lambda^a \quad (3)$$

(in the formula, λ(μm) is a wavelength,

α (cm$^{-1}$) is an absorption coefficient of the substrate 10 at 27° C., $N_e$ (cm$^{-3}$) is a free-electron concentration in the substrate 10, and K and a are constant; where $1.5 \times 10^{-19} \leq K \leq 6.0 \times 10^{-19}$, a=3).

The phrase "the absorption coefficient α is approximated by formula (3)" means that the absorption coefficient α is approximated by formula (3) according to a least-squares method. That is, the above-described provision encompasses not only the case where the absorption coefficient completely conforms with (satisfies) formula (3) but also the case where it satisfies formula (3) within the predetermined error range. Incidentally, the error of the measured absorption coefficient relative to the absorption coefficient α obtained from formula (3) at a wavelength of 2 µm is, for example, within ±0.1α, and preferably within ±0.01α.

The free-electron concentration $N_e$ in formula (3) is, for example, the free-electron concentration $N_{Elec}$ obtained based on the specific resistance of the substrate 10 and the mobility $\mu_{Elec}$ of the substrate 10 measured by the eddy current method, as described later.

The absorption coefficient α in the above-described wavelength range may be considered to satisfy formula (3'):

$$1.5\times10^{-19}N_e\lambda^3 \leq \alpha \leq 6.0\times10^{-19}N_e\lambda^3 \qquad (3')$$

The absorption coefficient α in the above-described wavelength range is approximated by formula (3") (it satisfies formula (3")) in a high-quality substrate among substrates 10 satisfying the above-described provision:

$$\alpha=2.2\times10^{-19}N_e\lambda^3 \qquad (3")$$

The provision "absorption coefficient α is approximated by formula (3")" encompasses, as with the above-described provision, not only the case where the absorption coefficient completely conforms to (satisfies) formula (3") but also the case where it satisfies formula (3") within the predetermined error range. Incidentally, the error of the actually measured absorption coefficient relative to the absorption coefficient α obtained from formula (3) at a wavelength of 2 µm is, for example, within ±0.1α, and preferably within ±0.01α.

In FIG. 2, the actually measured value of the absorption coefficient α in the GaN-crystal manufactured by the manufacturing method described below is indicated by a thin line. Specifically, the actually measured value of the absorption coefficient α at the free-electron concentration $N_e$ of $1.0\times10^{17}$ cm$^{-3}$ is indicated by a thin solid line, the actually measured value of the absorption coefficient ca at the free-electron concentration $N_e$ of $1.2\times10^{18}$ cm$^{-3}$ is indicated by a thin dotted line, and the actually measured value of the absorption coefficient α at the free-electron concentration $N_e$ of $2.0\times10^{18}$ cm$^{-3}$ is indicated by a thin dashed-dotted line. In FIG. 2, a function of formula (3) is indicated by a thick line. Specifically, a function of formula (3) at the free-electron concentration $N_e$ of $1.0\times10^{18}$ cm$^{-3}$ is indicated by a thick solid line, a function of formula (3) at the free-electron concentration $N_e$ of $1.2\times10^{18}$ cm$^{-3}$ is indicated by a thick dotted line, and a function of formula (3) at the free-electron concentration $N_e$ of $2.0\times10^{18}$ cm$^{-3}$ is indicated by a thick dashed-dotted line. As illustrated in FIG. 2, the actually measured value of the absorption coefficient α in the GaN-crystal manufactured by the manufacturing method described below can be fitted by a function of formula (3) with high accuracy. In the case of FIG. 2 (in the case of Si-doping), the absorption coefficient α is fitted by formula (3) with high accuracy where $K=2.2\times10^{-19}$.

Further, in the substrate 10 of this embodiment, since the absorption coefficient α at the wavelength range of at least 1 µm or more and 3.3 µm or less is approximated by formula (3), the absorption coefficient α of the substrate 10 at the predetermined wavelength λ has an approximately proportional relation to the free-electron concentration $N_e$.

Figure 3A:
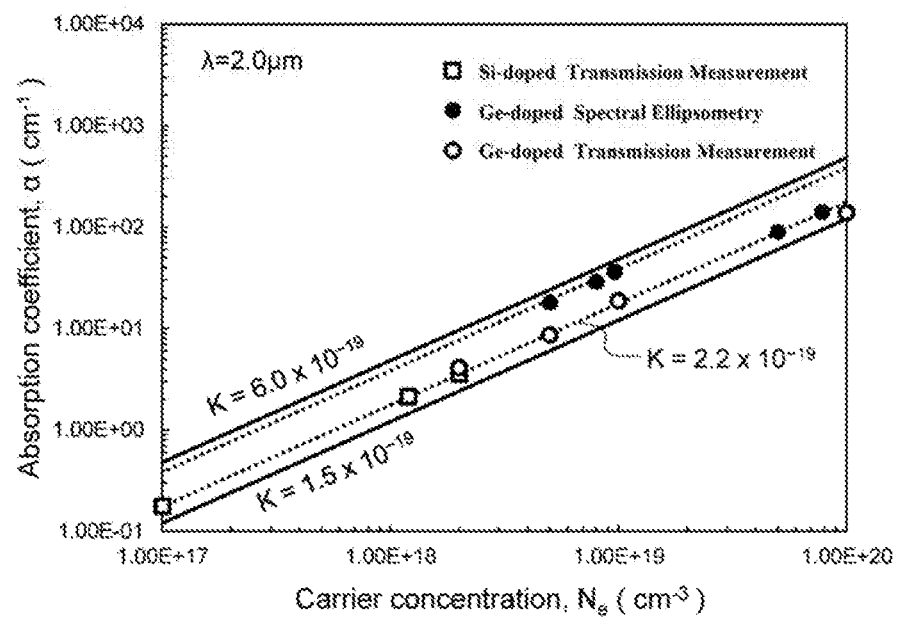
FIG. 3A is a diagram illustrating a relation of an absorption coefficient at a wavelength of 2 μm to a free-electron concentration in GaN-crystal manufactured by a manufacturing method according to an embodiment of the present invention.

FIG. 3A is a diagram illustrating a relation of the absorption coefficient at the wavelength of 2 µm relative to a free electron concentration in GaN-crystal manufactured by the manufacturing method according to this embodiment. In FIG. 3A, the lower solid line ($\alpha=1.2\times10^{-18}$ n) is a function of formula (3) into which $K=1.5\times10^{-19}$ and $\lambda=2.0$ are substituted, and the upper solid line ($\alpha=4.8\times10^{-18}$ n) is a function of formula (3) into which $K=6.0\times10^{-19}$ and $\lambda=2.0$ are substituted. Further, FIG. 3A illustrates not only a Si-doped GaN-crystal but also a Ge-doped GaN-crystal. In addition, it also illustrates a result of measuring an absorption coefficient by a transmission measurement and a result of measuring an absorption coefficient by a spectroscopic ellipsometry.

As illustrated in FIG. 3A, at a wavelength λ of 2.0 µm, an absorption coefficient α of the GaN-crystal manufactured by the manufacturing method described below has an approximately proportional relation to the free-electron concentration $N_e$. Moreover, the actually measured value of the absorption coefficient α in the GaN-crystal manufactured by the manufacturing method described below can be fitted by the function of formula (1) with high accuracy within a range of $1.5\times10^{-19} \leq K \leq 6.0\times10^{-19}$. Note that, since the GaN-crystal manufactured by the manufacturing method described below is of high quality, the actually measured value of the absorption coefficient α may often be fitted by the function of formula (3) into which $K=2.2\times10^{-19}$ is substituted, that is, fitted by $\alpha=1.8\times10^{-18}$ n with high accuracy.

As described above, since the absorption coefficient of the substrate 10 is approximated by formula (3) with high accuracy, variation in the absorption coefficient α of the substrate 10 relative to the free-electron concentration $N_e$ in the substrate 10 can be suppressed. Variation in the absorption coefficient α of the substrate 10 being suppressed indicates that variation in an extinction coefficient k described later is suppressed ($\alpha=4\pi k/\lambda$). Accordingly, in the substrate 10 of this embodiment, a carrier concentration No (free-electron concentration $N_e$) and the mobility $\mu_{IR}$ described later can be obtained with high accuracy based on the reflectance of the main surface measured by the reflection-type FTIR method.

(3) Carrier Concentration and Mobility in Nitride Crystal Substrate

As illustrated in FIG. 1A and FIG. 1B, the conductive type impurity concentration in the substrate 10 of this embodiment distributes approximately concentrically from the center side toward the outer side in the radial direction of the main surface 10s of the substrate 10 due to the VAS method, for example. Accordingly, the carrier concentration in the substrate 10 of this embodiment distributes approximately concentrically from the center side toward the outer side in the radial direction of the main surface 10s of the substrate 10, for example.

Note that, the phrase "distribute approximately concentrically" used herein may encompass, for example, the case where the center of the distribution is off-center of the main surface 10s of the substrate 10. An area surrounded by a isoconcentration line of carrier may not take the form of a perfect circle, but may take the form of, for example, an ellipse or a distorted circle.

In this embodiment, the carrier concentration in the substrate 10 distributes approximately concentrically from the center side of the main surface 10s in a plane view, for example. Here, a predetermined region including the center of the main surface 10s of the substrate 10 is referred to as a "center side region 10c", and a region surrounding the center side region 10c at a predetermined distance from the center of the main surface 10s of the substrate 10 is referred to as a "outer peripheral side region 10o". For example, the carrier concentration is slightly higher in the center side region 10c of the main surface 10s of the substrate 10, and the carrier concentration is slightly lower in the outer peripheral side region 10o surrounding the center side region 10c of the main surface 10s of the substrate 10.

The carrier concentration in the substrate 10 also distributes approximately concentrically from the center side of the main surface 90s, for example, in a sectional view as well. For example, the carrier concentration is slightly higher on the center side of the main surface 10s of the substrate 10 and slightly lower on the back surface side of the substrate 10.

In this embodiment, however, since the addition amount of the conductive type impurity is appropriately controlled by the manufacturing method described below, the carrier concentration in the substrate 10 is approximately uniform. In other words, the difference between the carrier concentration on the center side of the main surface 10s of the substrate 10 and the carrier concentration averaged across the entire thickness direction of the substrate 10 is small. In addition, a difference between the carrier concentration in the center side region 10c of the main surface 10s of the substrate 10 and the carrier concentration in the outer peripheral side region 10o of the main surface 10s of the substrate 10 is small. It should be noted that the mobility distribution is similar to the distribution of the carrier concentration.

In this embodiment, the carrier concentration and the mobility in the substrate 10 may be completely uniform. In other words, the carrier concentration and the mobility in the substrate 10 may not necessarily distribute approximately concentrically from the center of the main surface 10s of the substrate 10.

In this embodiment, the distributions of the carrier concentration and the mobility in the substrate 10 is defined by the carrier concentration $N_{IR}$ and the mobility $\mu_{IR}$ obtained based on the reflectance of the main surface measured, for example, by the reflection-type FTIR method. Details will be described below.

(3-1) Way to Obtain Carrier Concentration and Mobility by Reflection-Type FTIR Method A way to obtain the carrier concentration $N_{IR}$ and the mobility $\mu_{IR}$ on the main surface 10s side of the substrate 10 based on the reflectance of the main surface 10s measured by the reflection-type FTIR method will be explained.

For example, a Lorentz-Drude model is known as a dielectric function model used for analysis of an optical model. The Lorentz-Drude model considers not only a free carrier absorption but also a coupling between a LO phonon and a plasmon.

Specifically, a dielectric constant (complex dielectric constant) r in the Lorentz-Drude model is obtained by formula (4).

[Eq. 1]

$$\varepsilon = \varepsilon_\infty \left[ \frac{\omega_{LO}^2 - \omega^2 - i\omega\Gamma_{LO}}{\omega_{TO}^2 - \omega^2 - i\omega\Gamma_{LO}} - \frac{\omega_p^2}{\omega(\omega + i\gamma)} \right] \quad (4)$$

where $\varepsilon_\infty$ is a high-frequency dielectric constant. $\omega_{LO}$, $\omega_{TO}$, and $\omega_p$ are a LO phonon frequency, a TO phonon frequency, and a plasma frequency, respectively. $\Gamma_{LO}$, $\Gamma_{TO}$, and $\gamma$ are a LO phonon damping constant, a TO phonon damping constant, and a free carrier damping constant, respectively.

A plasma frequency $\omega_p$ is obtained by formula (5).

[Eq. 2]

$$\omega_p^2 = \frac{N_c e^2}{\varepsilon_\infty m^*} \quad (5)$$

where, $N_c$, e, and m* are a carrier concentration, an elementary charge, and an effective mass of a free carrier, respectively.

A free carrier damping constant γ is obtained by formula (6).

[Eq. 3]

$$\gamma = \frac{e}{m^* \mu} \quad (6)$$

where μ is a mobility.

Here, a dielectric constant ε in formula (4) is defined as follows: $\varepsilon \equiv \varepsilon_1 + i\varepsilon_2$. A complex refraction index N is defined as follows: $N \equiv n - ik$, where n is a refractive index and k is an extinction coefficient, provided that k>0.

A refractive index n is obtained by formula (7) using $\varepsilon_1$ and $\varepsilon_2$.

[Eq. 4]

$$n^2 = \frac{\varepsilon_1 + \sqrt{\varepsilon_1^2 + \varepsilon_2^2}}{2} \quad (7)$$

An extinction coefficient k is obtained by formula (8) using $\varepsilon_1$ and $\varepsilon_2$.

[Eq. 5]

$$k^2 = \frac{-\varepsilon_1 + \sqrt{\varepsilon_1^2 + \varepsilon_2^2}}{2} \quad (8)$$

Figure 4A:
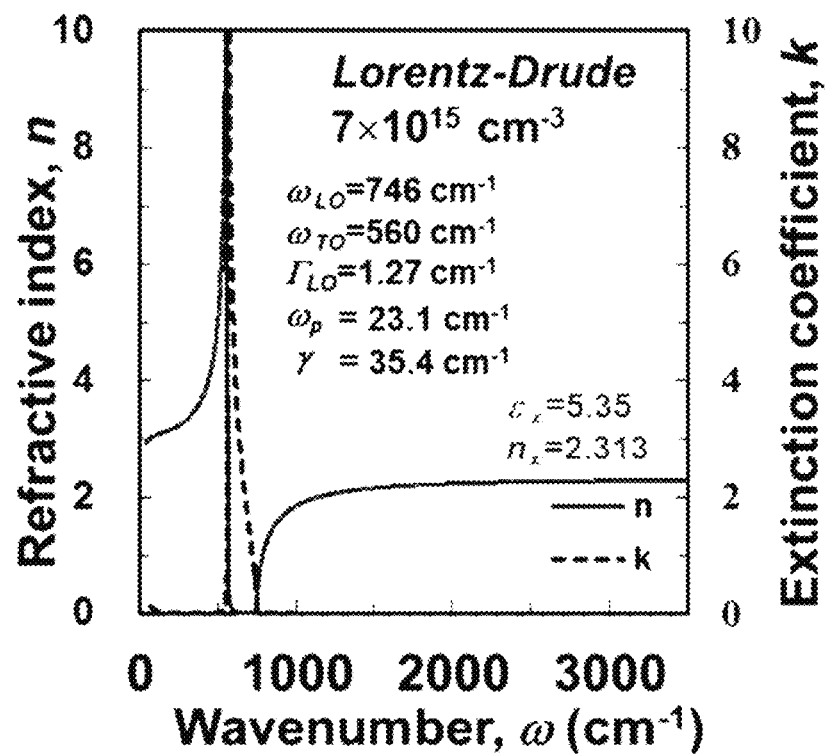
FIG. 4A is an explanatory diagram illustrating a specific example of an arithmetic result of a refractive index n and an extinction coefficient k by a Lorentz-Drude model, the arithmetic result being obtained at a carrier concentration of $7 \times 10^{15}$ cm$^{-3}$.
Figure 4B:
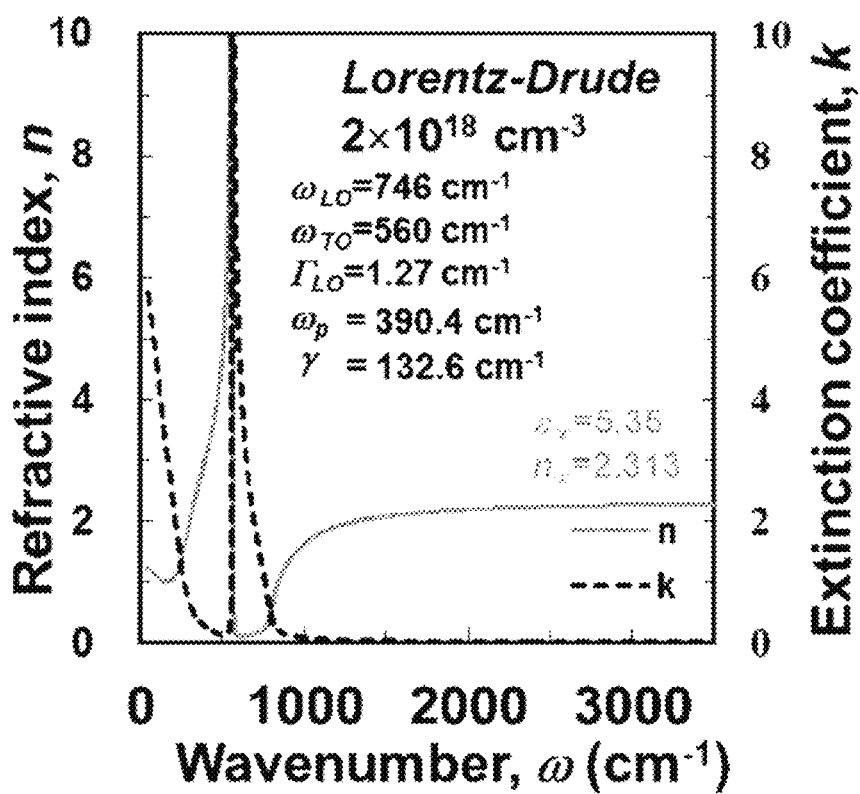
FIG. 4B is an explanatory diagram illustrating a specific example of an arithmetic result of a refractive index n and an extinction coefficient k by a Lorentz-Drude model, the arithmetic result being obtained at a carrier concentration of $2 \times 10^{18}$ cm$^{-3}$.

FIG. 4A is an explanatory diagram illustrating a specific example of an arithmetic result of a refractive index n and an extinction coefficient k by a Lorentz-Drude model, the arithmetic result being obtained at a carrier concentration of $7 \times 10^{15}$ cm$^{-3}$. FIG. 4B is an explanatory diagram illustrating a specific example of an arithmetic result of a refractive index n and an extinction coefficient k by a Lorentz-Drude model, the arithmetic result being obtained at a carrier concentration of $2 \times 10^{18}$ cm$^{-3}$.

In the GaN-crystal in the above case,
$\varepsilon_\infty = 5.35$,
$m_e^* = 0.22\ m_0$,
$\omega_{LO} = 735$ cm$^{-1}$,
$\omega_{TO} = 557$ cm$^{-1}$,
$\Gamma_{LO} = 12$ cm$^{-1}$,
$\Gamma_{TO} = 6$ cm$^{-1}$,
$\gamma = 35.4$ cm$^{-1}$ in FIG. 4A, and
$\gamma = 132.6$ cm$^{-1}$ in FIG. 4B.

As illustrated in FIGS. 4A and 4B, the refractive index n and the extinction coefficient k are different in a near-infrared region (600 to 2500 cm$^{-1}$) and in a far-infrared region (0 to 500 cm$^{-1}$) depending on the carrier concentration No and the mobility t. Their difference is reflected in the reflectance.

Figure 5A:
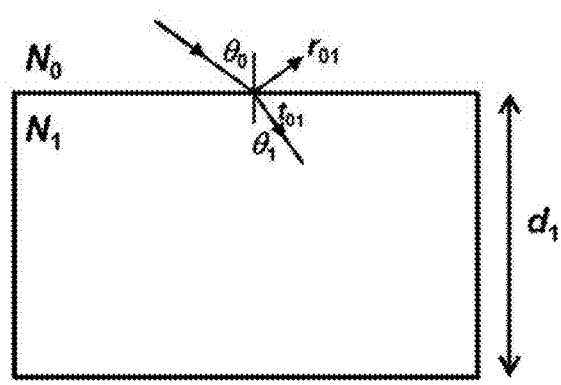
FIG. 5A is a pattern diagram illustrating an example of a monolayer optical model.

Next, an optical model of FIG. 5A is contemplated, simulating a reflection on the main surface 10s of the substrate 10. FIG. 5A is a pattern diagram illustrating an example of a monolayer optical model. In FIG. 5A, a medium $N_0$ is an atmospheric air or a vacuum, and a medium NT is the substrate 10. $r_{ij}$ is an amplitude reflection coefficient of light which enters a medium $N_j$ from a medium $N_i$, and is reflected from the medium $N_j$ toward the medium $N_i$.

The reflection of light depends on the complex index of the medium. The light is divided into p-polarized light and s-polarized light depending on the direction of the electric field when it enters the medium. The p-polarized light and the s-polarized light show different reflections. The plane which is perpendicular to the interface between the media and includes the incident/reflected lights is called an "incident plane", and the p-polarized light is polarized light in which an electric field oscillates in the incident plane, and the s-polarized light is polarized light in which the electric field oscillates perpendicularly to the incident plane.

An amplitude reflection coefficient of the p-polarized light $r_p$ is obtained by formula (9).

[Eq. 6]

$$r_p = \frac{N_{ti}^2 \cos\theta_i - \sqrt{N_{ti}^2 - \sin^2\theta_i}}{N_{ti}^2 \cos\theta_i + \sqrt{N_{ti}^2 - \sin^2\theta_i}}, N_{ti} = N_t/N_i \quad (9)$$

On the other hand, an amplitude reflection coefficient of the s-polarized light $r_s$ is obtained by formula (10).

[Eq. 7]

$$r_s = \frac{\cos\theta_i - \sqrt{N_{ti}^2 - \sin^2\theta_i}}{\cos\theta_i + \sqrt{N_{ti}^2 - \sin^2\theta_i}}, N_{ti} = N_t/N_i \quad (10)$$

In formula (9) and formula (10), $\theta_i$ is an incident angle of the light from a medium $N_i$. $N_{ti}$ is a complex refraction index of the light incident from a medium i into a medium t.

An intensity reflectance is obtained by formula (11).

[Eq. 8]

$$R = \frac{r_p^2 + r_s^2}{2} + \frac{R_p + R_s}{2} \quad (11)$$

Incidentally, in the case of normal incidence ($\theta_i = 0$), the intensity reflectance is obtained by formula (12).

[Eq. 9]

$$R = R_p(= r_p^2) \quad (12)$$
$$= R_s(= r_s^2)$$
$$= \frac{(n-1)^2 + k^2}{(n+1)^2 + k^2}$$

In FIG. 5A, an intensity reflectance R of the light reflected at the interface between the medium $N_0$ and the medium $N_1$ is obtained by the following procedures. Firstly, a dielectric constant ε of the medium $N_1$ is obtained by assigning $\varepsilon_\infty$, m*, $\omega_{LO}$, $\omega_{TO}$, $\Gamma_{LO}$ and $\Gamma_{TO}$ in the GaN-crystal as the medium $N_1$ to formula (1) to formula (3). After the dielectric constant ε of the medium $N_1$ is obtained, the refractive index n and the extinction coefficient k of the medium $N_1$ are obtained according to formula (7) and formula (8). Note that the medium $N_0$ is assumed to be a vacuum and n=1, and k=0. After the refractive index n and the extinction coefficient k are obtained, $N_0$ and $N_1$ are assigned to formula (9) and formula (10) assuming i=0 and t=1 to thereby obtain $r_{01,p}$ and $r_{01,s}$. After $r_{01,p}$ and $r_{01,s}$ are obtained, the $r_{01,p}$ and $r_{01,s}$ are assigned to formula (11). Accordingly, the intensity reflectance R is obtained. It is noted that the carrier concentration $N_c$ and the mobility μ in the medium $N_1$ are taken as fitting parameters described later.

Figure 6:
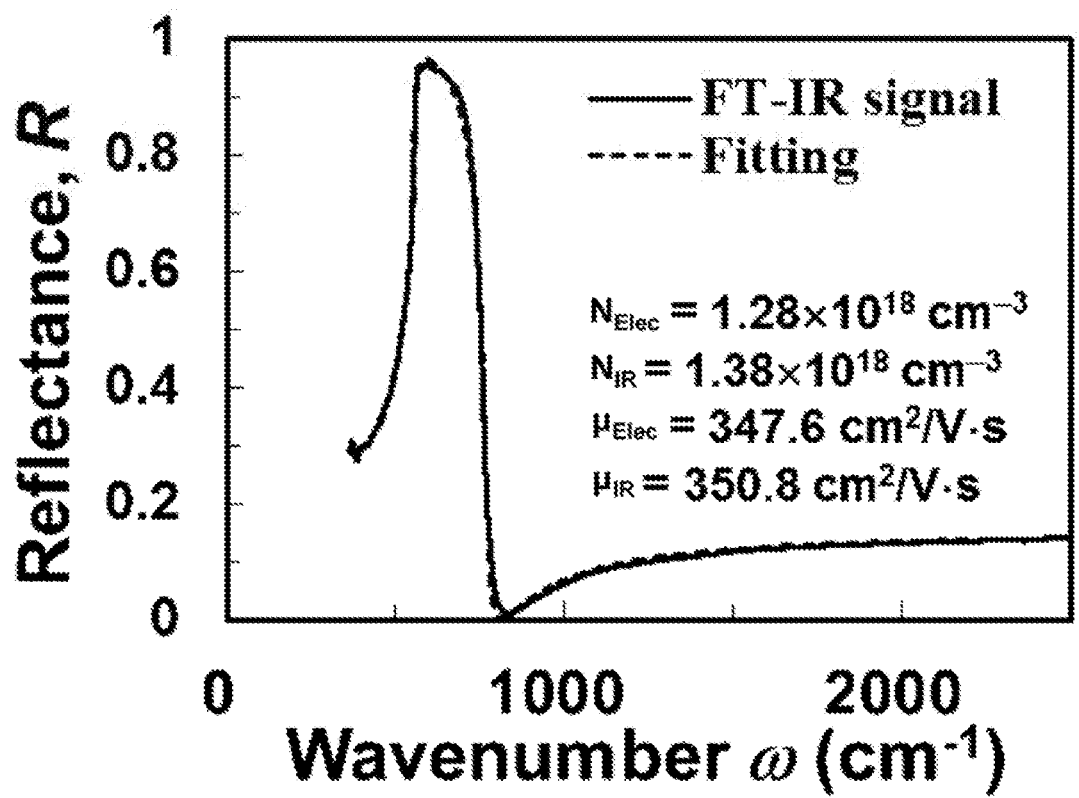
FIG. 6 is a diagram illustrating a reflectance spectrum of a main surface of a nitride crystal substrate 10 according to an embodiment of the present invention measured by a reflection-type FTIR method and a reflectance spectrum of the main surface of the nitride crystal substrate 10 according to the embodiment of the present invention fitted by a Lorentz-Drude model.

Now, fitting of the reflectance spectrum of the substrate 10 will be explained using FIG. 6. FIG. 6 is a diagram illustrating the reflectance spectrum of the main surface of the nitride crystal substrate 10 according to this embodiment measured by the reflection-type FTIR method and the reflectance spectrum of the main surface of the nitride crystal substrate 10 according to this embodiment fitted by a Lorentz-Drude model. In the measurement of the reflectance spectrum in FIG. 6, it was assumed that $\theta_0=30°$.

As illustrated in FIG. 6, the reflectance spectrum of the main surface 10s of the substrate 10 (a solid line in the figure) is obtained by the measurement by the reflection-type FTIR method After the reflectance spectrum is obtained, the intensity reflectance R obtained from the above-described theoretical formula (a dashed line in the figure) is fitted to the reflectance spectrum actually measured by the FTIR method, by using the carrier concentration $N_c$ and the mobility u in the substrate 10 of the medium $N_1$ as the fitting parameters. As a result of fitting, the carrier concentration $N_c$ and the mobility μ in the substrate 10 when the reflectance spectrum actually measured by the FTIR method is in the best agreement with the intensity reflectance R obtained from the theoretical formula are obtained.

Accordingly, the carrier concentration $N_{IR}$ on the main surface 10s side of the substrate 10 and the mobility $μ_{IR}$ on the main surface 10s side of the substrate 10 are obtained based on the reflectance of the main surface 10s measured by the reflection-type FTIR method.

Note that in the measurement by the reflection-type FTIR method, the reflection of the light on the main surface 10s of the substrate 10 occurs near the main surface 10s of the substrate 10. Accordingly, the carrier concentration $N_{IR}$ and the mobility $μ_{IR}$ obtained based on the reflectance of the main surface 10s measured by the reflection-type FTIR method are not physical property values reflecting the inside of the substrate 10 but physical property values reflecting only the main surface 10s side of the substrate 10.

(3-2) Way to Obtain Carrier Concentration and Mobility by the Electrical Measurement In this embodiment, the carrier concentration $N_{Elec}$ and the mobility $μ_{Elec}$ of the substrate 10 may be obtained by the following method.

The mobility $μ_{Elec}$ of the substrate 10 is measured by the eddy current method. The resistance of the substrate 10 is measured with a stylus type resistance measuring instrument. Further, the thickness of the substrate 10 is measured with a micrometer. After the resistance (sheet resistance) of the substrate 10 and the thickness of the substrate 10 are obtained, they are converted into a specific resistance ρ. The mobility $\mu_{Elec}$ and the specific resistance ρ of the substrate 10 obtained from these measurements are assigned in formula (13) to thereby obtain a carrier concentration $N_{Elec}$ of the substrate 10:

$$1/\rho = eN_{Elec}\mu_{Elec} \qquad (13)$$

It is confirmed that the carrier concentration $N_{Elec}$ and the mobility $\mu_{Elec}$ of the substrate 10 obtained by the above-described method coincide with the carrier concentration and the mobility obtained by the hole measurement according to the Van der Pauw method.

In the eddy current method described above, measurement of the mobility $\mu_{Elec}$ is performed across the entire thickness direction of the substrate 10. Therefore, the carrier concentration $N_{Elec}$ and the mobility $\mu_{Elec}$ of the substrate 10 obtained by the above-described method is physical property values averaged across the entire thickness direction of the substrate 10 as a bulk.

(3-3) Carrier Concentration Ratio

In this embodiment, the difference between the carrier concentration on the center side of the main surface 10s of the substrate 10 and the carrier concentration averaged across the entire thickness direction of the substrate 10 is small, as described above. Accordingly, $N_{IR}/N_{Elec}$ is small, which is a ratio of the carrier concentration $N_{IR}$ at the center of the main surface 10s of the substrate 10 obtained based on the reflectance of the main surface measured by the reflection-type FTIR method to the carrier concentration $N_{Elec}$ in the substrate 10 obtained by the electrical measurement. The $N_{IR}/N_{Elec}$ is hereinafter also referred to as a "carrier concentration ratio".

Figure 7A:
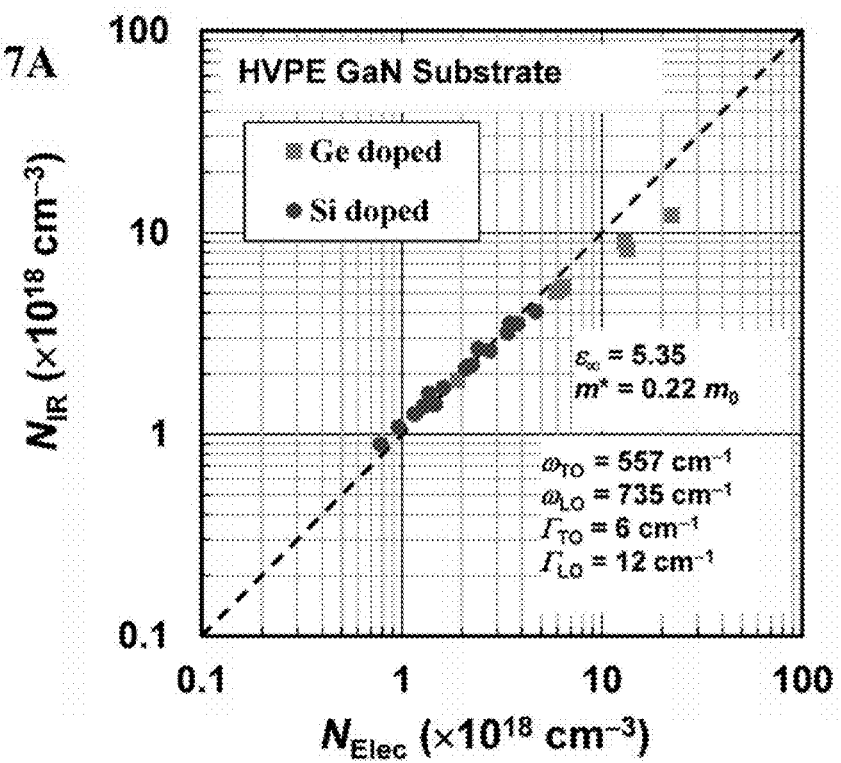
FIG. 7A is a diagram illustrating a relation of a carrier concentration $N_{IR}$ in the nitride crystal substrate 10 obtained based on the reflectance of the main surface measured by the reflection-type FTIR method to a carrier concentration $N_{Elec}$ in the nitride crystal substrate 10 obtained by an electrical measurement.
Figure 7B:
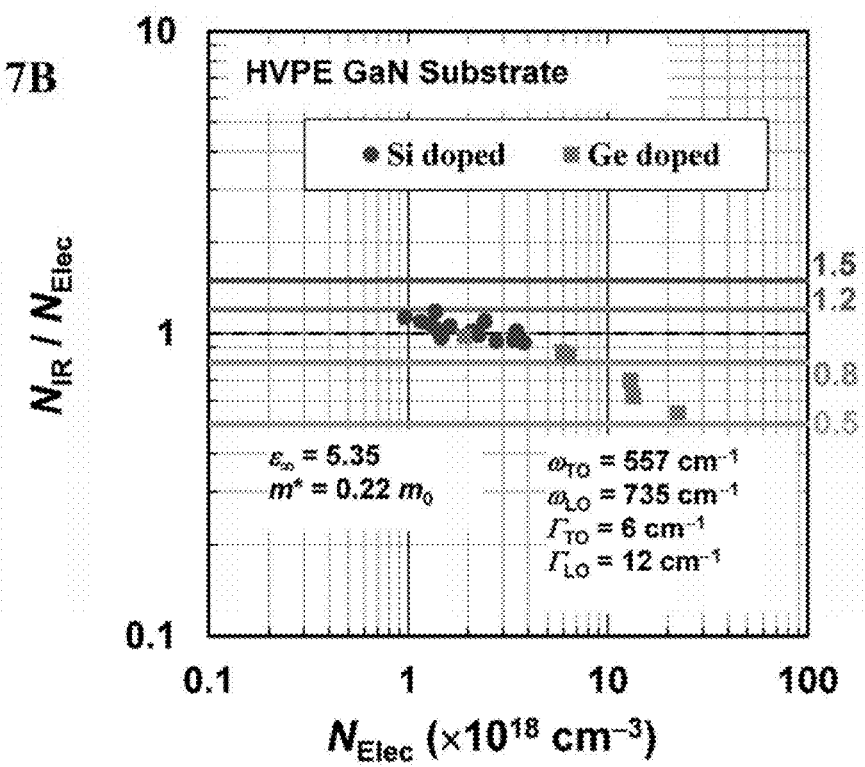
FIG. 7B is a diagram illustrating the relation of the carrier concentration ratio $N_{IR}/N_{Elec}$ to the carrier concentration $N_{Elec}$ in the nitride crystal substrate 10 obtained by the electrical measurement.

FIG. 7A is a diagram illustrating a relation of a carrier concentration $N_{IR}$ in a nitride crystal substrate 10 obtained based on the reflectance of the main surface measured by the reflection-type FTIR method to the carrier concentration $N_{Elec}$ in the nitride crystal substrate 10 obtained by the electrical measurement, and FIG. 7B is a diagram illustrating a relation of the carrier concentration ratio $N_{IR}/N_{Elec}$ to the carrier concentration $N_{Elec}$ in the nitride crystal substrate 10 by the electrical measurement. Note that the carrier concentration $N_{IR}$ is a value obtained based on the reflectance at the center of the main surface 10s. Further, the constants in the figure were used for fitting to the reflectance spectrum. In this case, $\theta_0 = 30°$.

As illustrated in FIG. 7A, in this embodiment, actual measurement points of ($N_{Elec}$, $N_{IR}$) are close to a straight line of $N_{IR} = N_{Elec}$. In other words, the carrier concentration $N_{Elec}$ obtained by the electrical measurement almost conforms with the carrier concentration $N_{IR}$ obtained by the reflection-type FTIR method.

This result indicates that, in this embodiment, the reflectance spectrum actually measured by the FTIR method and the intensity reflectance R obtained by the theoretical formula were able to be fitted each other with high accuracy, and the carrier concentration $N_{IR}$ on the main surface 10s side of the substrate 10 was able to be measured with high accuracy. In other words, the substrate 10 of this embodiment can be indirectly confirmed to have good crystal quality.

In addition, this result indicates that the difference between the carrier concentration at the center of the main surface 10s of the substrate 10 measured by the reflection-type FTIR method and the carrier concentration averaged across the entire thickness direction of the substrate 10 obtained by the electrical measurement is small. In other words, it is found that the carrier concentration in the substrate 10 is approximately uniform in the thickness direction.

As illustrated in FIG. 7B, the carrier concentration ratio $N_{IR}/N_{Elec}$ according to this embodiment falls within a predetermined range close to 1. Specifically, the carrier concentration ratio $N_{IR}/N_{Elec}$ satisfies, for example, formula (1):

$$0.5 \leq N_{IR}/N_{Elec} \leq 1.5 \qquad (1).$$

Preferably, in a case where the n-type impurity is Si or $N_{Elec}$ is $9 \times 10^{17}$ cm$^{-3}$ or more and $7 \times 10^{18}$ cm$^{-3}$ or less, the carrier concentration ratio $N_{IR}/N_{Elec}$ satisfies, for example, formula (1'):

$$0.8 \leq N_{IR}/N_{Elec} \leq 1.2 \qquad (1').$$

When the carrier concentration ratio $N_{IR}/N_{Elec}$ is less than 0.5 or more than 1.5, the carrier concentration in the substrate 10 is non-uniform in the thickness direction. It corresponds to the carrier concentration in the substrate 10 being non-uniform also in the direction along the main surface 10s, since the substrate 10 is manufactured by the VAS method. In a case that the carrier concentration in the substrate 10 is non-uniform in the direction along the main surface 10s, there is a possibility that device properties are varied among a plurality of semiconductor devices when the plurality of semiconductor devices are cut from the substrate 10. In contrast, since the carrier concentration ratio $N_{IR}/N_{Elec}$ is 0.5 or more and 1.5 or less, the carrier concentration in the substrate 10 is approximately uniform not only in the thickness direction but also in the direction along the main surface 10s. Accordingly, when a plurality of semiconductor devices are cut from the substrate 10, variation among the plurality of semiconductor devices can be suppressed. Further, with the carrier concentration ratio $N_{IR}/N_{Elec}$ of 0.8 or more and 1.2 or less, difference in device properties among the plurality of semiconductor devices can be reduced.

Let the carrier concentration on the main surface 10s side of the substrate 10 obtained by the reflection-type FTIR method be $N_{IRF}$, and let the carrier concentration on the back surface side of the substrate 10 obtained by the reflection-type FTIR method be $N_{IRR}$. Then the carrier concentration ratio $N_{IRF}/N_{IRR}$ is confirmed to satisfy, for example, formula (1"):

$$0.5 \leq N_{IRF}/N_{IRR} \leq 1.5 \qquad (1'').$$

In the case where the n-type impurity is Ge (square in the figure), the carrier concentration ratio $N_{IR}/N_{Elec}$ tends to shift gradually away from 1 as the carrier concentration $N_{Elec}$ increases. The reason is considered as follows. Fermi effect is an effect where a lattice constant changes with the increase of free carriers in a crystal. The Fermi effect resulting from the increase of free carriers in the GaN-crystal is positive whether the n-type impurity is Si or Ge. On the other hand, the size effect depends on an atomic radius of the impurity, and is an effect where a lattice constant changes with the increase of the impurity concentration in the crystal. The size effect resulting from the increase of the concentration of Si in the GaN-crystal is negative. Meanwhile, the size effect resulting from the increase of the concentration of Ge in the GaN-crystal is smaller than the size effect resulting from the increase of the concentration of Si in the GaN-crystal. Combining these effects, the Fermi effect is offset by the size effect in the case where the n-type impurity is Si, whereas both the Fermi effect and the size effect are positive in the case where the n-type impurity is Ge. Accordingly, in the case where the n-type impurity is Ge, there occurs a difference in LO phonon damping constant $\Gamma_{LO}$ compared to that of the case where the n-type impurity is Si, as the concentration $N_{Elec}$ (i.e., Ge concentration) increases. Therefore, it is believed that the carrier concentration ratio $N_{IR}/N_{Elec}$ had tendency of gradually shifting away from 1.

(3-4) Mobility Ratio

In this embodiment, the difference between the mobility on the center side of the main surface 10s of the substrate 10 and the mobility averaged across the entire thickness direction of the substrate 10 is small, as described above. Accordingly, $\mu_{IR}/\mu_{Elec}$ is small, which is a ratio of the mobility $\mu_{IR}$ at the center of the main surface 10s of the substrate 10 obtained based on the reflectance of the main surface measured by the reflection-type FTIR method to the mobility $\mu_{Elec}$ in the substrate 10 obtained by the electrical measurement. The a $\mu_{IR}/\mu_{Elec}$ is hereinafter also referred to as a "mobility ratio".

FIG. 8A is a diagram illustrating a relation of the mobility $\mu_{IR}$ in the nitride crystal substrate 10 obtained based on the reflectance of the main surface measured by the reflection-type FTIR method to the mobility $\mu_{Elec}$ the nitride crystal substrate 10 obtained by the electrical measurement, and FIG. 8B is a diagram illustrating a relation of the mobility ratio $\mu_{IR}/\mu_{Elec}$ to the mobility $\mu_{Elec}$ in the nitride crystal substrate 10 obtained by the electrical measurement. Note that the mobility $\mu_{IR}$ is a value obtained based on the reflectance at the center of the main surface 10s. Further, the constants illustrated in the figure were used for fitting to the reflectance spectrum.

As illustrated in FIG. 8A, in this embodiment, actual measurement points of ($\mu_{Elec}$, $\mu_{IR}$) are close to a straight line of $\mu_{IR}=\mu_{Elec}$. In other words, the mobility $\mu_{Elec}$ obtained by the electrical measurement almost conforms with the mobility $\mu_{IR}$ obtained by the reflection-type FTIR method.

This result indicates that, in this embodiment, the reflectance spectrum actually measured by the FTIR method and the intensity reflectance R obtained by the theoretical formula were able to be fitted each other with high accuracy, and the mobility $\mu_{IR}$ on the main surface 10s side of the substrate 10 was able to be measured with high accuracy. In other words, the substrate 10 of this embodiment can be indirectly confirmed to have good crystal quality.

In addition, this result indicates that the difference between the mobility at the center of the main surface 10s of the substrate 10 obtained by the reflection-type FTIR method and the mobility averaged across the entire thickness direction of the substrate 10 obtained by the electrical measurement is small. In other words, it is found that the mobility in the substrate 10 is approximately uniform in the thickness direction.

As illustrated in FIG. 8B, the mobility ratio $\mu_{IR}/\mu_{Elec}$ according to this embodiment falls within a predetermined range close to 1. Specifically, the mobility ratio $\mu_{IR}/\mu_{Elec}$ satisfies, for example, formula (2):

$$0.6 \leq \mu_{IR}/\mu_{Elec} \leq 1.4 \quad (2)$$

Preferably, in a case where the n-type impurity is Si or $\mu_{Elec}$ is 100 cm²/V·s or more and 400 cm²/V·s or less, the mobility ratio $\mu_{IR}/\mu_{Elec}$ satisfies, for example, formula (2'):

$$0.7 \leq \mu_{IR}/\mu_{Elec} \leq 1.1 \quad (2')$$

When the mobility ratio $\mu_{IR}/\mu_{Elec}$ is less than 0.6 or more than 1.4, the mobility in the substrate 10 is non-uniform in the thickness direction. It corresponds to the mobility in the substrate 10 being non-uniform also in the direction along the main surface 10s, since the substrate 10 is manufactured by the VAS method. In a case that the mobility in the substrate 10 is non-uniform in the direction along the main surface 10s, there is a possibility that device properties are varied among a plurality of semiconductor devices when the plurality of semiconductor devices are cut from the substrate 10. In contrast, since the mobility ratio $\mu_{IR}/\mu_{Elec}$ is 0.6 or more and 1.4 or less, the mobility in the substrate 10 is approximately uniform not only in the thickness direction but also in the direction along the main surface 10s. Accordingly, when a plurality of semiconductor devices are cut from the substrate 10, variation among the plurality of semiconductor devices can be suppressed. Further, with the mobility ratio $\mu_{IR}/\mu_{Elec}$ of 0.7 or more and 1.1 or less, difference in device properties among the plurality of semiconductor devices can be reduced.

(3-5) Maximum in-Plane Carrier Concentration Difference

In this embodiment, a difference between the carrier concentration in the center side region 10c of the main surface 10s of the substrate 10 and the carrier concentration in the outer peripheral side region 10o of the main surface 10s of the substrate 10 is small, as described above.

An extreme value (a maximum value or a minimum value) of the carrier concentration $N_{IR}$ in the center side region 10c on the center side of the main surface 10s of the substrate 10 obtained by the reflection-type FTIR method is referred to as a "first carrier concentration $N_{IR1}$". An extreme value of the carrier concentration NR, opposite to the first carrier concentration $N_{IR1}$ and obtained in an outer peripheral side region 10o by the reflection-type FTIR method, the outer peripheral side region 10o surrounding the center side region 10c at a radial position of 20 mm or less from the center of the main surface 10s of the substrate 10, is referred to as a second carrier concentration $N_{IR2}$. The larger of the first carrier concentration $N_{IR1}$ and the second carrier concentration $N_{IR2}$ is referred to as "Max($N_{IR1},N_{IR2}$)".

In this embodiment, a maximum in-plane carrier concentration difference, calculated by $|N_{IR1}-N_{IR2}|/\text{Max}(N_{IR1},N_{IR2})\times 100$ is 18% or less, and preferably 6% or less. In a case that the maximum in-plane carrier concentration difference of more than 18%, when a plurality of semiconductor devices are cut from the substrate 10, there may be possibly a considerable difference in device properties between a semiconductor device obtained from the center side region 10c and a semiconductor device obtained from the outer peripheral side region 10o. In contrast, since the maximum in-plane carrier concentration difference is 18% or less, when a plurality of semiconductor devices are cut from the substrate 10, the difference in device properties between a semiconductor device obtained from the center side region 10c and a semiconductor device obtained from the outer peripheral side region $10_o$ can be suppressed from increasing. Further, since the maximum in-plane carrier concentration difference is 6% or less, the difference in device properties between a semiconductor device obtained from the center side region 10c and a semiconductor device obtained from the outer peripheral side region 10o can be reduced.

(4) Method for Manufacturing Nitride Crystal Substrate

Figure 9:
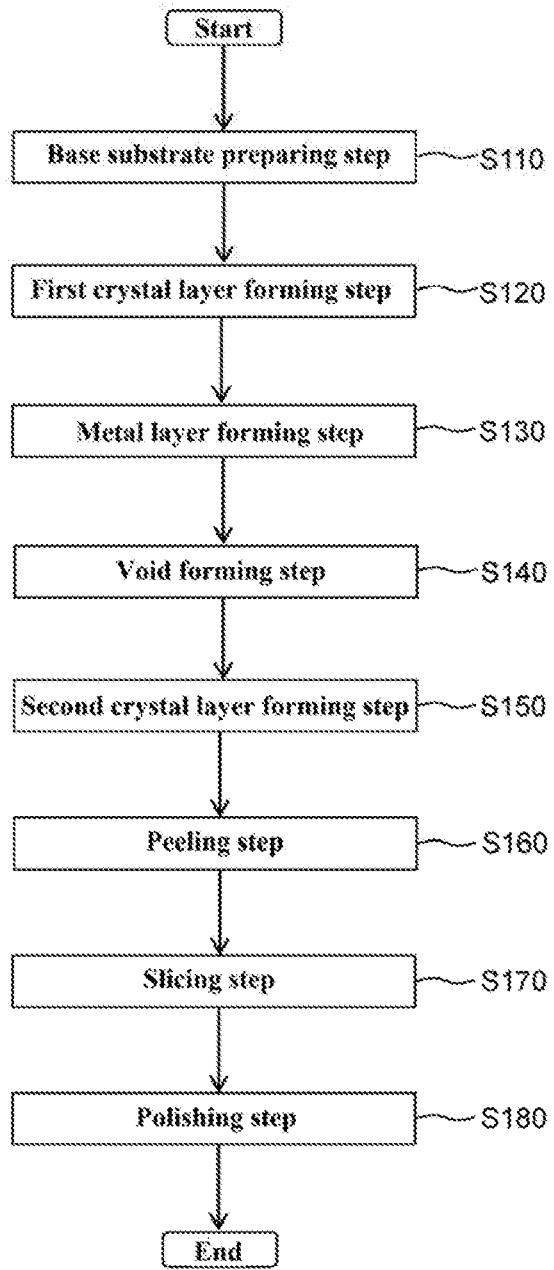
FIG. 9 is a flow chart illustrating a method for manufacturing a nitride crystal substrate 10 according to an embodiment of the present invention.

Using FIG. 9 and FIG. 10, a method for manufacturing a nitride crystal substrate 10 according to the present invention will be explained. FIG. 9 is a flow chart illustrating a method for manufacturing a nitride crystal substrate 10 according to this embodiment. Note that a step is abbreviated as S. FIG. 10A to FIG. 10G are schematic cross-sectional diagrams illustrating a method for manufacturing a nitride crystal substrate 10 according to this embodiment.

As illustrated in FIG. 9, in a method for manufacturing the substrate 10 of this embodiment, for example, the substrate 10 is manufactured by the VAS method. Specifically, the method for manufacturing the substrate 10 of this embodiment includes, for example, a base substrate preparing step S110, a first crystal layer forming step S120, a metal layer forming step S130, a void forming step S140, a second crystal layer forming step S150, a peeling step S160, a slicing step S170, and a polishing step S180.

(S110: Base Substrate Preparing Step)

First, as illustrated in FIG. 10 A, a base substrate 1 (also referred to as a substrate for crystal growth; hereinafter abbreviated as "substrate 1" in some cases) is prepared. The substrate 1 is, for example, a sapphire substrate. The substrate 1 may be, for example, a Si substrate or gallium arsenide (GaAs) substrate. The substrate 1 has a main surface is which is to be a growth surface. A low-index crystal plane closest to the main surface $1s$ is, for example, a c-plane.

In this embodiment, the c-plane of the substrate 1 is inclined to the main surface $1s$, for example. A c-axis of the substrate 1 is inclined to the normal line of the main surface $1s$ by a predetermined off angle, for example. Incidentally, off angles in the main surface $1s$ of the substrate 1 are uniform over the entire main surface.

(S120: First Crystal Layer Forming Step)

Figure 10A:
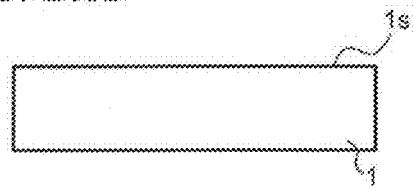
FIG. 10A to FIG. 10G are schematic cross-sectional diagrams illustrating the method for manufacturing a nitride crystal substrate 10 according to an embodiment of the present invention.
Figure 10B:
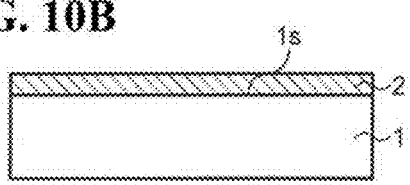

Next, as illustrated in FIG. 10B, for example, trimethyl gallium (TMG) gas as a group-III source gas, ammonia gas ($NH_3$) as a nitriding agent gas, and monosilane ($SiH_4$) gas as a predetermined conductive type dopant gas are supplied to a substrate 1 heated to a predetermined growth temperature by the Metal Organic Chemical Vapor Deposition (MOVPE) method. Accordingly, a low-temperature growth GaN buffer layer and a Si doped GaN layer are grown in this order as a first crystal layer (base growth layer) 2 on the main surface is of the substrate 1. At this time, the thickness of the low-temperature growth GaN buffer layer and the thickness of the Si doped GaN layer are, for example, 20 nm and 0.5 µm, respectively.

(S130: Metal Layer Forming Step)

Figure 10C:
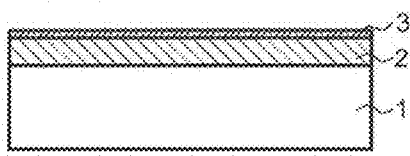

As illustrated in FIG. 10C, a metal layer 3 is deposited on the first crystal layer 2. As the metal layer 3, for example, a titanium (Ti) layer is formed. The thickness of the metal layer 3 is, for example, 20 nm.

(S140: Void Forming Step)

Figure 10D:

Next, as illustrated in FIG. 10D, the above-described substrate 1 is charged into an electric furnace, and the substrate 1 is mounted on a susceptor having a predetermined heater. After the substrate 1 is mounted on the susceptor, the substrate 1 is heated with a heater and subjected to a heat treatment in an atmosphere containing hydrogen gas or hydride gas. Specifically, heat treatment is performed, for example, in $H_2$ gas stream containing 20% $NH_3$ gas at a predetermined temperature for 20 minutes. The heat treatment temperature is, for example, 850° C. or more and 1,100° C. or less. Since such a heat treatment is performed, the metal layer 3 is nitrided to thereby form a metal nitride layer 5 having high-density micropores on the surface thereof. Moreover, since the above-described heat treatment is performed, a first crystal layer 2 is partly etched through the pores in the metal nitride layer 5 to thereby form high-density voids in the first crystal layer 2. Accordingly, a void-containing first crystal layer 4 is formed.

(S150: Second Crystal Layer Forming Step)

Next, using a hydride vapor phase epitaxy apparatus (HVPE apparatus) 200, a second crystal layer (full-growth layer) 6 formed of group-III nitride crystal containing a predetermined conductive type impurity is formed on the void-containing first crystal layer 4 and the metal nitride layer 5. At this time, a carrier concentration on the crystal growth surface side of the second crystal layer 6 is measured by the optical measurement, and an addition amount of the conductive type impurity is feedback controlled according to the carrier concentration on the crystal growth surface side. Details will be described below.

(i) HVPE Apparatus

Figure 11:
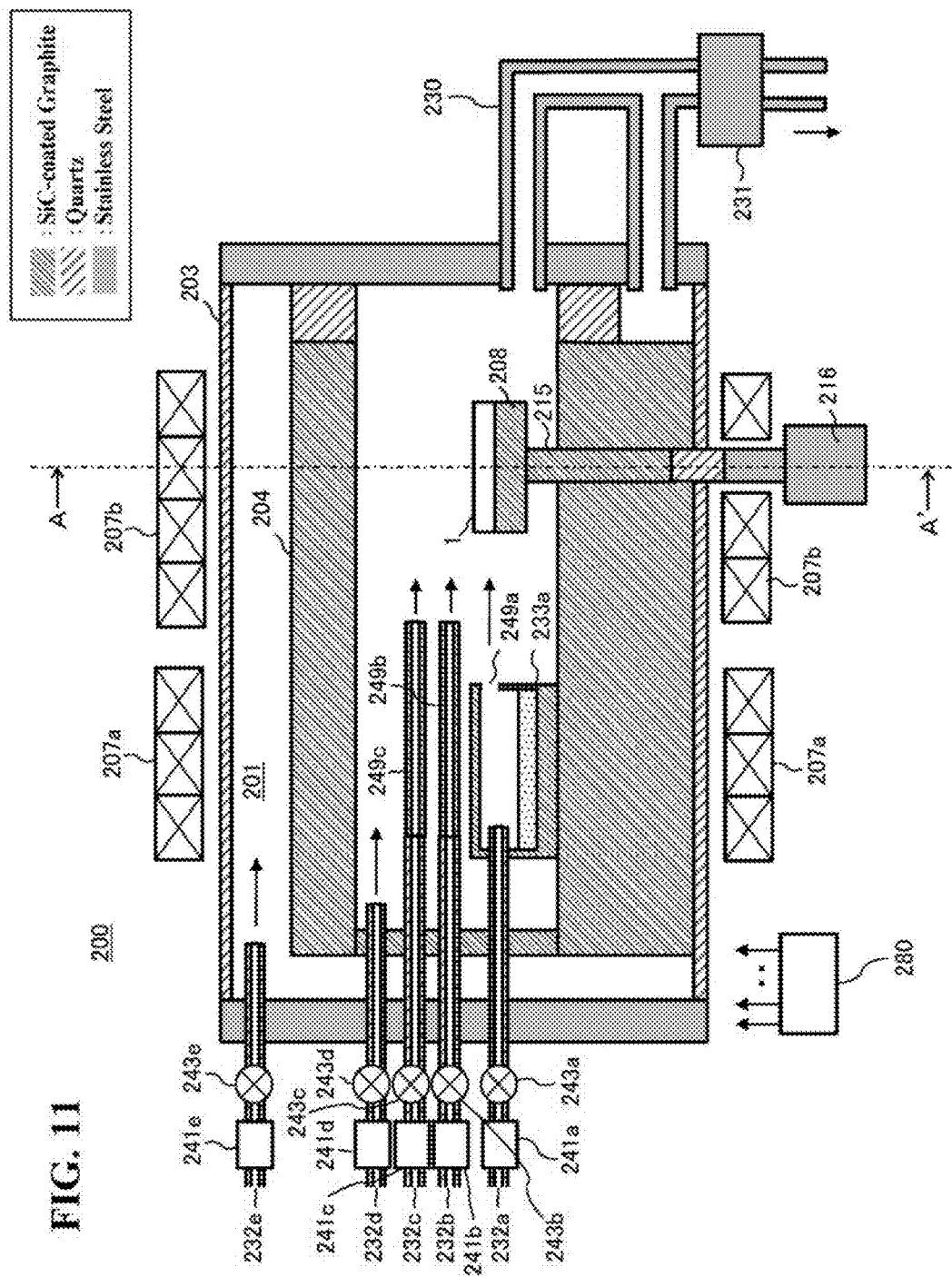
FIG. 11 is a schematic block diagram of a HVPE apparatus 200.

Using FIG. 11, a configuration of the HVPE apparatus 200 used for the growth of the second crystal layer 6 will be explained. FIG. 11 is a schematic block diagram of the HVPE apparatus 200.

As illustrated in FIG. 11, the HVPE apparatus 200 is provided with an airtight vessel 203 having a film-forming chamber 201 configured therein. In the film-forming chamber 201, an inner cover 204 is provided. At the position surrounded by the inner cover 204, the susceptor 208 is provided into which the substrate 1 is to be placed. The susceptor 208 is connected to a rotary axis 215 of a rotary mechanism 216, which is configured to be able to rotate corresponding to the driving of the rotary mechanism 216.

The airtight vessel 203 includes, at its one end, a gas supply pipe 232a for supplying hydrogen chloride (HCl) gas into a gas generator 233a, a gas supply pipe 232b for supplying ammonia ($NH_3$) gas into an inner cover 204, a gas supply pipe 232c for supplying a dopant gas containing a conductive type impurity into the inner cover 204, a gas supply pipe 232d for supplying a mixed gas ($N_2/H_2$ gas) of nitrogen ($N_2$) gas and hydrogen ($H_2$) gas as a purge gas into the inner cover 204, and a gas supply pipe 232e for supplying $N_2$ gas as a purge gas into the film-forming chamber 201 connected thereto. The supply pipes 232a to 232e are provided respectively with flow rate controllers 241a to 241e, and valves 243a to 243e in this order from upstream side. The gas generator 233a which contains the Ga melt as a Ga-source is provided downstream of the gas supply pipe 232a. The gas generator 233a is provided with a nozzle 249a which supplies gallium chloride (GaCl) gas produced by the reaction between HCl gas and the Ga melt toward the substrate 1 placed on the susceptor 208. On the downstream side of the gas supply pipes 232b, 232c, nozzles 249b, 249c are provided, which supply various gases supplied from these gas supply pipes toward the substrate 1 placed on the susceptor 208. The nozzles 249a to 249c are arranged so as to flow gases in the direction parallel to the surface of the susceptor 208. In other words, supply of the gas is performed by a so-called side flow.

As a dopant gas, for example, but not limited to, dichlorosilane ($SiH_2O_2$) gas or silane ($SiH_4$) gas in the case of Si-doping, and dichlorogermane ($GeH_2Cl_2$) gas or germane ($GeH_4$) gas in the case of Ge-doping may be respectively used. The dopant gas is, for example, supplied as a mixed gas with carrier gases such as $N_2/H_2$ gas from the nozzle 249c. In the case where the dopant gas is a halide gas, for example, HCl gas may be flowed along with the dopant gas for the purpose of suppressing thermnolysis of the halide gas.

The airtight vessel 203 includes, at the other end thereof, an exhaust pipe 230 for exhausting the inside of the film-forming chamber 201. The exhaust pipe 230 is provided with a pump (or blower) 231. The airtight vessel 203 includes, on the outer periphery thereof, zone heaters 207a, 207b for heating the inside of the gas generator 233a and the substrate 1 on the susceptor 208 to a temperature respectively desirable for each region. The airtight vessel 203 also includes a temperature sensor (not shown) provided therein for measuring a temperature in the film-forming chamber 201.

Among the constituent members of the above-described HVPE apparatus 200, each member for forming various gas streams is, for example, configured as follows in order to enable crystal growth at a low impurity concentration described later.

Specifically, as identifiably illustrated with different hatching patterns in FIG. 11, a member containing a quartz-free and boron-free material is preferably used as a member forming a high temperature region in the reaction container 203, the high temperature region being heated to a crystal growth temperature (for example, 1,000° C. or more) with radiation from zone heaters 207*a*, 207*b* and being contacted with gas supplied to the substrate 1. Specifically, as a member constituting the high temperature region, for example, a member containing silicon carbide (SiC) coated graphite is preferably used. On the other hand, in a relatively lower temperature region, a member is preferably configured using high-purity quartz. In other words, each member is configured using SiC coated graphite instead of high-purity quartz in the high temperature region which reaches a relatively higher temperature and is contacted with HCl gas or the like. More particularly, the inner cover 204, the susceptor 208, the rotary axis 215, the gas generator 233*a*, nozzles 249*a* to 249*c* and the like contain SiC coated graphite. It should be noted that a furnace tube constituting the airtight vessel 203 has no other choice but to contain quartz. Therefore, the inner cover 204, which surrounds the susceptor 208, the gas generator 233*a* and the like, is provided in the film-forming chamber 201. Wall portions at either end of the airtight vessel 203, the exhaust pipe 230 and the like may be configured using a metal material such as stainless steel.

For example, "Polyakov et al. J. Appl. Phys. 115, 183706 (2014)" discloses that since growth occurs at 950° C., the growth of GaN-crystal with low impurity concentration can be attained. However, such low-temperature growth leads to degraded crystal quality, failing to yield a product excellent in thermophysical properties, electrical properties, and the like.

In contrast, as for the above-described HVPE apparatus 200 according to this embodiment, each member is configured using SiC coated graphite in the high temperature region which reaches relatively higher temperature and is contacted with HCl gas or the like. With this arrangement, for example, impurities derived from quartz, stainless steel, and the like, such as Si, O, C, Fe, Cr, Ni, and the like can be blocked from being supplied to the crystal growth part even in a temperature range of 1,050° C. which is suitable for growth of the GaN-crystal. As a result, the GaN-crystal which is of high purity and exhibits good thermophysical properties and electrical property can be grown.

Members included in the HVPE apparatus 200 are connected to a controller 280 configured as a computer, and the procedures and treatment conditions described later are controlled by the program performed on the controller 280.

(ii) FTIR Measurement Apparatus

Figure 12:
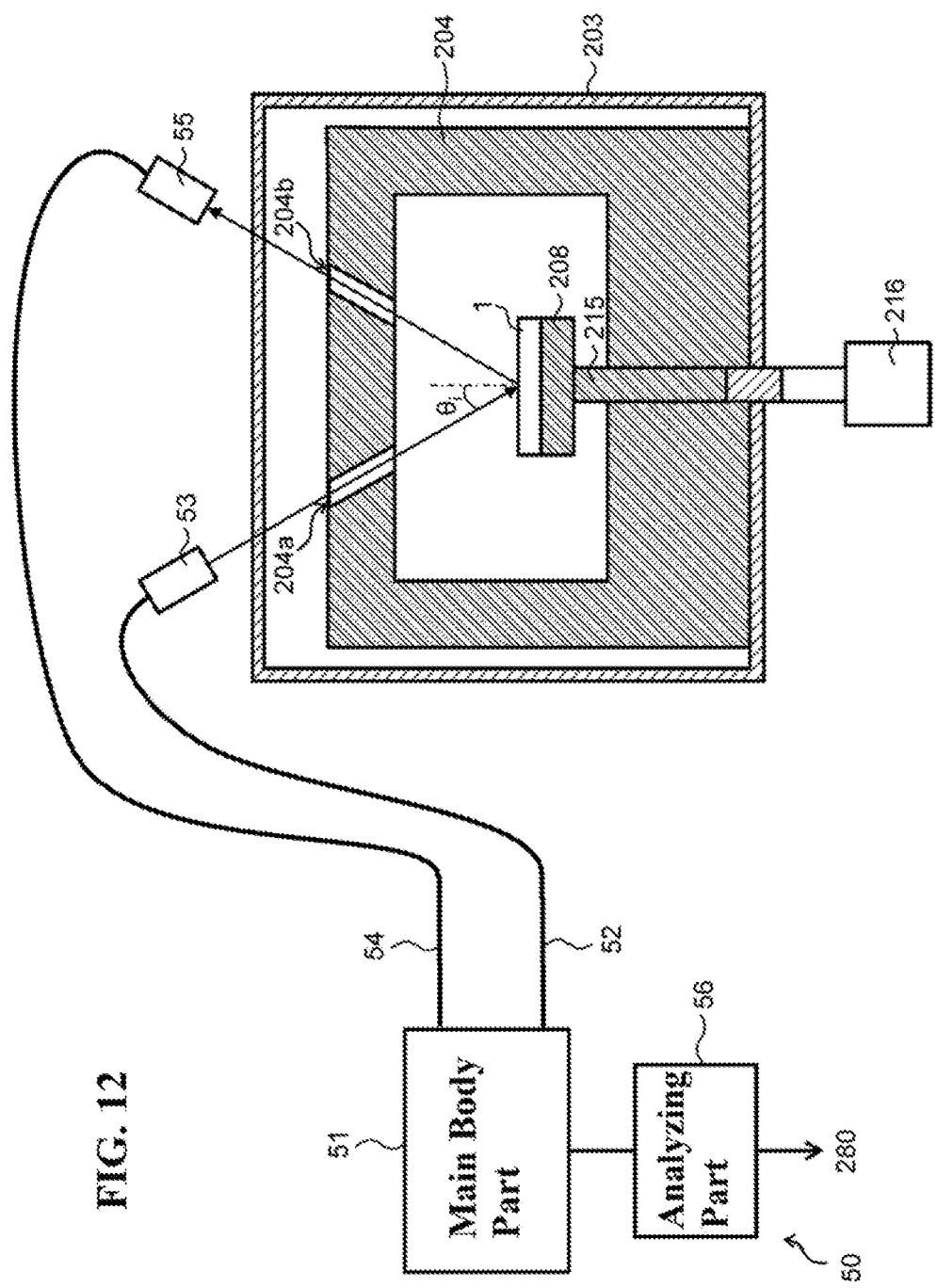
FIG. 12 is a schematic block diagram of the HVPE apparatus 200 and a FTIR measurement apparatus 50.

Next, using FIG. 12, a FTIR measurement apparatus 50 accompanying the HVPE apparatus 200 will be explained. FIG. 12 is a schematic block diagram illustrating the HVPE apparatus 200 and the FTIR measurement apparatus 50. FIG. 12 is a cross-sectional diagram taken along line A-A' of FIG. 11. In FIG. 12, a zone heater 207*b* is omitted.

As illustrated in FIG. 12, a FTIR measurement apparatus 50 is provided with, for example, a main body part (measurement part) 51, a light emitting part 53, a light receiving part 55, and an analyzing part 56.

The main body part 51 is configured, for example, to convert predetermined infrared light into interfering light (interferogram), and to externally emit the interfering light. Specifically, the main body part 51 includes, for example, a light source (not shown), a half mirror (not shown), a stationary mirror (not shown), and a movable mirror (not shown). The infrared light from the light source is obliquely incident on the half mirror and then divided into transmitted light and reflected light. The transmitted light will be reflected from the stationary mirror, and the reflected light will be reflected from the movable mirror. The light will return to the half mirror and be synthesized. Accordingly, interfering light will be generated. At this time, since the position of the movable mirror is shifted along the reflected light, different interfering light can be obtained. The main body part 51 is configured, for example, to detect reflected light from the substrate 1.

The light emitting part 53 is, for example, connected to the main body part 51 through an optical fiber 52. The light emitting part 53 is configured, for example, to irradiate an interfering light to the substrate 1 on the susceptor 208 at a predetermined incident angle $\theta_i$ through the airtight vessel 203 and an opening 204*a* of the inner cover 204.

The light receiving part 55 is, for example, connected to the main body part 51 through an optical fiber 54. The light receiving part 55 is configured, for example, to receive reflected light from the substrate 1 on the susceptor 208 through the airtight vessel 203 and an opening 204*b* of the inner cover 204.

The analyzing part 56 is configured, for example, to make a spectrum analysis of the reflected light from the substrate 1 detected by the main body part 51 using Fourier transformation. The analyzing part 56 is also configured, for example, to obtain a carrier concentration $N_c$ of the second crystal layer 6 being growing by fitting the intensity reflectance R obtained from the above-described theoretical formula to the actually measured reflectance spectrum. The analyzing part 56 is connected to the controller 280 of the HVPE apparatus 200, and configured to send the analysis result to the controller 280.

(iii) Growth Process

The second crystal layer 6 is grown using the HVPE apparatus 200 and the FTIR measurement apparatus 50 according to the following procedures. The operation of the member constituting the HVPE apparatus 200 referred hereinafter is controlled by the controller 280.

Upon completion of loading the substrate 1 into the film-forming chamber 201, the furnace port is closed, and the supply of $H_2$ gas, or $H_2$ gas and $N_2$ gas into the film-forming chamber 201 is started while heating and exhausting the film-forming chamber 201 and rotating the susceptor 208. Thereafter, when the temperature and the pressure inside of the reaction chamber 201 reach a desired treatment temperature and a desired treatment pressure to thereby attain a desired atmosphere in the film-forming chamber 201, the supply of HCl gas and $NH_3$ gas from the gas supply pipes 232*a*, 232*b* is started, and a film forming gas containing GaCl gas, $NH_3$ gas, and a dopant gas is supplied to the main surface is of the substrate 1.

Figure 10E:
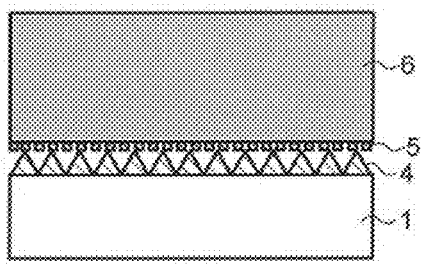

With this arrangement, as illustrated in FIG. 10E, a second crystal layer 6 is formed on the void-containing first crystal layer 4 and the metal nitride layer 5. At this time, for example, since $SiH_2Cl_2$ gas is supplied as a dopant gas, Si is added as the n-type impurity into the second crystal layer 6.

At this time, the temperature is, for example, set to 700 to 900° C. in the zone heater 207*a* while the temperature is, for example, set to 1,000 to 1,200° C. in the zone heater 207b. With this arrangement, the temperature of the susceptor 208 is adjusted to a predetermined temperature from 1,000 to 1,200° C. It should be noted that a temperature control using an internal heater (not shown) may be performed where the temperature of the susceptor 208 is within a range of 1,000 to 1,200° C.

Examples of other treatment conditions of this step include the followings:

Treatment pressure: 0.5 to 2 atm;
Partial pressure of GaCl gas: 0.1 to 20 kPa;
Partial pressure of $NH_3$ gas/partial pressure of GaCl gas: 1 to 100;
Partial pressure of $H_2$ gas/partial pressure of GaCl gas: 0 to 100;
Partial pressure of $SiH_2Cl_2$ gas: $2.5 \times 10^{-5}$ to $1.3 \times 10^{-3}$ kPa.

(iv) Feedback Control with Carrier Concentration

In the process of growing the second crystal layer 6, the film forming gas is supplied by a side flow. Accordingly, the position to which the film forming gas is supplied is fixed and a gas channel through which the film forming gas flows is almost steady. On the other hand, as crystal growth of the second crystal layer 6 proceeds, the position of the crystal growth surface of the second crystal layer 6 is relatively changed. For example, in the HVPE apparatus 200 of this embodiment, as the crystal growth of the second crystal layer 6 proceeds, the position of the crystal growth surface of the second crystal layer 6 gradually becomes higher relative to the film forming gas channel.

Accordingly, for example, a growth rate is relatively higher in an initial stage and a middle stage of a crystal growth process, whereas the growth rate tends to decrease in a final stage of the crystal growth process. At this time, an addition amount of the conductive impurity tends to decrease when the crystal growth rate is high and to increase when the crystal growth rate is low. Therefore, when the growth rate decreases as the crystal growth proceeds, the impurity concentration in the second crystal layer 96 may gradually increase from bottom to top in the thickness direction of the second crystal layer 6.

In view of the foregoing, for example, the carrier concentration $N_c$ on the crystal growth surface side of the second crystal layer 6 is measured in-situ by the optical measurement, and the addition amount of the conductive type impurity is feedback control led according to the carrier concentration $N_c$ on the crystal growth surface side of the second crystal layer 6 in this embodiment. Accordingly, for example, the carrier concentration in the second crystal layer 6 can be uniform in the thickness direction.

In this embodiment, since the above-described HVPE apparatus 200 is used, the crystal quality of the second crystal layer 6 can be good. Therefore, the carrier concentration $N_c$ on the crystal growth surface side of the second crystal layer 6 can be measured by the optical measurement with high accuracy even when the second crystal layer 6 is growing.

In this embodiment, for example, the above-described reflection-type FTIR measurement apparatus 50 is used for the optical measurement.

Specifically, since the interfering light is irradiated to the substrate 1 while the second crystal layer 6 is gradually growing and the reflected light from the substrate 1 is received, a reflection spectrum is detected. After the reflectance spectrum is obtained, the intensity reflectance R obtained from the above-described theoretical formula is fitted to the actually measured reflectance spectrum. As a result of fitting, the carrier concentration $N_c$ on the crystal growth surface side of the second crystal layer 6 when the actually measured reflectance spectrum is in the best agreement with the intensity reflectance R obtained from the theoretical formula is obtained. After the carrier concentration $N_c$ on the crystal growth surface side of the second crystal layer 6 is obtained, the addition amount of the conductive type impurity is feedback controlled based on the carrier concentration $N_c$.

At this time, during the in-situ measurement using the FTIR measurement apparatus 50, not only reflected light from the substrate 1 but also infrared light derived from heat radiation from the substrate 1 side to be heated are received. Accordingly, the influence of the infrared light derived from the heat radiation will be eliminated by the following procedures. Specifically, at first, a reference substrate is previously prepared before production of the substrate 10, the reference substrate totally reflecting light on its surface. The reference substrate is heated to the growth temperature of the second crystal layer 6. As the reference substrate, the substrate is used in which metal having a melting point higher than the growth temperature of the second crystal layer 6 is formed. Specifically, the reference substrate is a sapphire substrate in which platinum (Pt) is formed. After the reference substrate is heated, interfering light is irradiated to the reference substrate, and a reference spectrum including totally reflected light from the reference substrate and infrared light derived from the heat radiation is measured. In the actual process of growing the second crystal layer 6, since a reflection spectrum ratio including the reflected light from the substrate 1 and the infrared light derived from the heat radiation to the reference spectrum is calculated, the influence of the infrared light derived from the heat radiation is eliminated.

At this time, the optical model to be adapted to fitting is modified depending on the thickness of the second crystal layer 6.

(Initial Stage of Crystal Growth Process)

In the initial stage of the crystal growth process, reflected light spectrum is obtained from a laminate structure including the substrate 1, the void-containing first crystal layer 4, the metal nitride layer 5, and the second crystal layer 6. However, since a reflection component from the side lower than the metal nitride layer 5 is small, the actual laminate structure can be considered as a bilayer structure including only a metal nitride layer 5 and a second crystal layer 6.

Figure 5B:
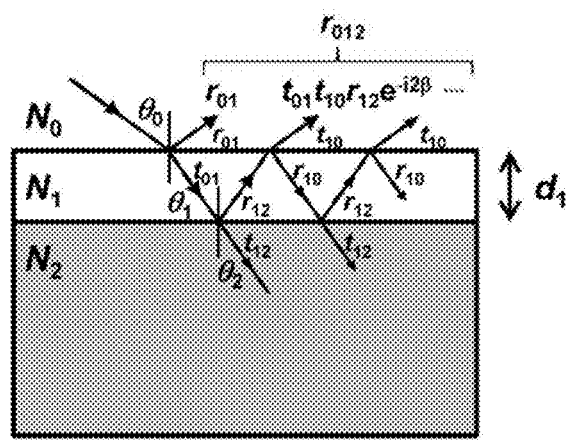
FIG. 5B is a pattern diagram illustrating an example of a bilayer optical model.

Here, based on the reflection in the bilayer structure including only the metal nitride layer 5 and the second crystal layer 6, an optical model in FIG. 5B is contemplated. FIG. 5B is a pattern diagram illustrating an example of a bilayer optical model. A medium $N_0$ is an atmospheric air or a vacuum, a medium $N_1$ is the second crystal layer 6, and a medium $N_2$ is the metal nitride layer 5.

In the optical model of the bilayer structure, a multiple reflection in the second crystal layer 6 is considered for an amplitude reflection coefficient $r_{012}$. The amplitude reflection coefficient $r_{012}$ is obtained from formula (14) using Fresnel equation:

[Eq. 10]

$$r_{012} = \frac{r_{01} + r_{12}\exp(-i2\beta)}{1 + r_{01}r_{12}\exp(-i2\beta)} \quad (14)$$

The phase variation $\beta$ in formula (14) is obtained by formula (15). In formula (15), $\theta_1$ and $\theta_0$ are incident angles of light. $N_1$ is a complex refraction index of the second crystal layer 6.

[Eq. 11]

$$\beta = \frac{2\pi d_1}{\lambda} N_1 \cos\theta_1 \quad (15)$$
$$= \frac{2\pi d_1}{\lambda}(N_1^2 - \sin^2\theta_0)^{0.5}$$

In FIG. 5B, an intensity reflectance R in the optical model of the bilayer structure is obtained by the following procedures. Firstly, refractive indices $n_1$ and $n_2$, extinction coefficients $k_1$ and $k_2$ in the medium $N_1$ and the medium $N_2$ are obtained by formula (1) to formula (3), formula (7) and formula (8). After the refractive indices and the extinction coefficients are obtained, $r_{01,p}$, $r_{01,s}$, $r_{12,p}$ and $r_{12,s}$ are obtained by formula (9) and formula (10). After the $r_{01,p}$, $r_{01,s}$, $r_{12,p}$ and $r_{12,s}$ are obtained, these amplitude reflection coefficients are assigned to formula (14) to obtain $r_{012,p}$ and $r_{012,s}$. After $r_{012,p}$ and $r_{012,s}$ are obtained, the $r_{012,p}$ and $r_{012,s}$ are assigned to formula (11). Thus the intensity reflectance R in the optical model of the bilayer structure is obtained.

After reflection spectrum is obtained by the FTIR method, the intensity reflectance R obtained by the above-described theoretical formula is fitted to the reflectance spectrum actually measured by the FTIR method, using as the fitting parameters the carrier concentration $N_c$ and the mobility p in the second crystal layer 6 and the thickness di of the second crystal layer 6 which is the medium $N_1$. As a result of fitting, the carrier concentration $N_c$ and the mobility t on the crystal growth surface side of the second crystal layer 6 and the thickness di of the crystal layer 6 when the reflectance spectrum actually measured by the FTIR method is in the best agreement with the intensity reflectance R obtained from the theoretical formula are obtained. After these fitting parameters are obtained, the addition amount of the conductive type impurity is feedback controlled based on the carrier concentration $N_c$.

It should be noted that the optical model of the bilayer structure is applied to the case that the thickness di of the second crystal layer 6 is 100 μm or less. When the thickness d, of the second crystal layer 6 as obtained by the above-described fitting is more than 100 μm, the following optical model is applied.

(Middle Stage and Final Stage of Crystal Growth Process)

In the middle stage and the final stage of the crystal growth process where the thickness dr of the second crystal layer 6 is more than 100 μm, the reflection component on the surface of the metal nitride layer 5 or under the metal nitride layer 5 becomes small. Therefore, the actual laminate structure can be considered as a monolayer structure including the second crystal layer 6 alone.

Accordingly, in the same manner as in obtaining the intensity reflectance R of the above-described substrate 10, the intensity reflectance R of the laminate structure can be obtained while the second crystal layer 6 is growing.

After the reflection spectrum is obtained by the FTIR method, the intensity reflectance R obtained by the above-described theoretical formula is fitted to the reflectance spectrum actually measured by the FTIR method, using as the fitting parameters the carrier concentration No and the mobility μ in the second crystal layer 6 which is the medium $N_1$, After the fitting, in the same manner as in the initial stage of the crystal growth process, the addition amount of the conductive type impurity is feedback controlled based on the carrier concentration $N_c$ on the crystal growth surface side of the second crystal layer 6.

(Influence of Intrinsic Carrier Concentration)

The carrier concentration No on the crystal growth surface side of the second crystal layer 6 used for the above-described control is a carrier concentration at the growth temperature of the second crystal layer 6, In the second crystal layer 6 formed of GaN-crystal, an intrinsic carrier concentration to be thermally excited between bands (between a valence band and a conduction band) becomes higher as the temperature rises. However, even when the second crystal layer 6 reaches the crystal growth temperature, the intrinsic carrier concentration to be thermally excited between the bands of the GaN-crystal is less than about $7\times10^{15}$ cm$^{-3}$ which is sufficiently lower than the concentration (for example, $1\times10^{17}$ cm$^{-3}$ or more) of the free carrier generated in the GaN-crystal resulting from doping with the conductive type impurity. In other words, the carrier concentration $N_c$ of the second crystal layer 6 at the growth temperature of the second crystal layer 6 can be considered to be almost equal to the carrier concentration $N_c$ of the second crystal layer 6 at room temperature. Therefore, based on the carrier concentration $N_c$ on the crystal growth surface side of the second crystal layer 6 at the growth temperature of the second crystal layer 6, the addition amount of the conductive type impurity can be feedback controlled while predicting the carrier concentration in the finished substrate 10 at room temperature.

(v) Specific Details of Feedback Control

In this embodiment, for example, the addition amount of the conductive type impurity is feedback controlled so that the carrier concentration in the second crystal layer 6 is to be uniform in the thickness direction depending on the carrier concentration $N_c$ on the crystal growth surface side of the second crystal layer 6.

Specifically, for example, in the finished substrate 10, the addition amount of the conductive type impurity is feedback controlled so that the carrier concentration ratio $N_{IR}/N_{Elec}$ satisfies formula (1).

For example, in an apparatus in which the growth rate of the second crystal layer 6 gradually decreases like a HVPE apparatus 200 of this embodiment, the addition amount of the conductive type impurity is gradually decreased corresponding to the gradual decrease of the growth rate of the second crystal layer 6. Accordingly, the relative increase of the concentration of the conductive type impurity in the second crystal layer 6 resulting from the decrease of the growth rate of the second crystal layer 6 can be suppressed. At this time, for example, a partial pressure of a dopant gas is decreased in order to gradually decrease the addition amount of the conductive type impurity. When the growth rate of the second crystal layer 6 gradually decreases, the partial pressure of GaCl gas may be increased to suppress the decrease of the growth rate.

For example, in an apparatus in which the growth rate of the second crystal layer 6 gradually increases, the addition amount of the conductive type impurity may be gradually increased corresponding to the gradual increase of the growth rate of the second crystal layer 6. Accordingly, the relative decrease of the concentration of the conductive type impurity in the second crystal layer 6 resulting from the increase of the growth rate of the second crystal layer 6 can be suppressed. At this time, for example, a partial pressure of a dopant gas is increased in order to gradually increase the addition amount of the conductive type impurity. When the growth rate of the second crystal layer 6 gradually increases, the partial pressure of GaCl gas may be decreased to suppress the increase of the growth rate.

Since such control is performed, the carrier concentration ratio $N_{IR}/N_{Elec}$ in the finished substrate 10 can be made to satisfy formula (1).

(vi) Regarding Crystal Growth Process

In the second crystal layer forming step S150, the second crystal layer 6 grows from the void-containing first crystal layer 4 through pores in the metal nitride layer 5 onto the void-containing first crystal layer 4 and the metal nitride layer 5. Some voids in the void-containing first crystal layer 4 are embedded by the second crystal layer 6, while other voids in the void-containing first crystal layer 4 remains. A flat gap is formed between the second crystal layer 6 and the metal nitride layer 5, the gap being due to voids that remain in the void-containing first crystal layer 4. Such a gap will cause the second crystal layer 6 to peel in a peeling step S160 described later.

At this time, tensile stress is introduced in the second crystal layer 6, which results from internuclear attraction between island-like initial nuclei in the growth process of the second crystal layer 6. Moreover, dislocation is bent in a process in which the initial nucleus forming the second crystal layer 6 is grown in a transverse direction. Accordingly, a dislocation density of the second crystal layer 6 decreases gradually in the thickness direction.

At this time, the second crystal layer 6 is grown carrying over the orientation in the substrate 1. In other words, the off angles in the main surface of the second crystal layer 6 at this time are uniform across the entire main surface as with the off angles in the main surface 1s of the substrate 1.

At this time, the thickness of the second crystal layer 6 is, for example, 600 μm or more, and preferably 1 mm or more. The upper limit of the thickness of the second crystal layer is not particularly limited. However, the thickness of the second crystal layer 6 is preferably 50 mm or less from the viewpoint of improved productivity.

(S160: Peeling Step)

After completion of the growth of the second crystal layer 6, supply of HCl gas into the gas generator 233a, supply of $H_2$ gas into the film-forming chamber 201 and heating with the zone heaters 207a and 207b were stopped while supplying $NH_3$ gas and $N_2$ gas into the film-forming chamber 201 and exhausting the inside of the film-forming chamber 201. When the temperature in the film-forming chamber 201 is decreased to 500° C. or less, the supply of $NH_3$ gas is stopped, and atmosphere in the film-forming chamber 201 is replaced with $N_2$ gas and is restored to the atmospheric pressure. Then, the temperature in the film-forming chamber 201 is decreased, for example, to a temperature of 200° C. or less, that is, a temperature at which the substrate 1 can be unloaded from the airtight vessel 203.

At this time, the second crystal layer 6 spontaneously peels from the substrate 1 at the boundary of the void-containing first crystal layer 4 and the metal nitride layer 5 in a process of cooling the HVPE apparatus 200 used for growing the second crystal layer 6.

At this time, tensile stress is introduced in the second crystal layer 6. Accordingly, the internal stress acts on the second crystal layer 6 resulting from the tensile stress generated in the second crystal layer 6 so that the front surface side of the second crystal layer 6 is concave. Further, the dislocation density on the main surface (front surface) 6s side of the second crystal layer 6 is lower, while the dislocation density on the back surface side of the second crystal layer 6 is higher. Therefore, the internal stress acts on the second crystal layer 6 also resulting from the difference of the dislocation density in the thickness direction of the second crystal layer 6 so that the front surface side of the second crystal layer 6 is concave.

Figure 10F:
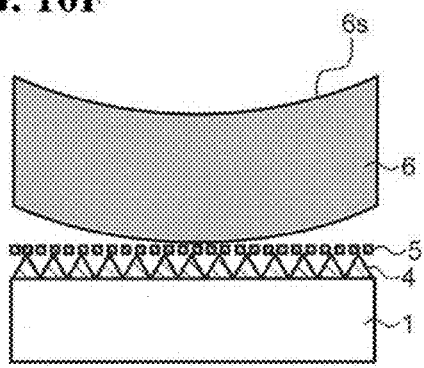

As a result, as illustrated in FIG. 10F, the second crystal layer 6 is warped so that the front surface side thereof becomes concave after peeled from the substrate 1.

However, since the addition amount of the conductive type impurity has been feedback controlled according to the carrier concentration $N_c$ on the crystal growth surface side of the second crystal layer 6 in the above-described second crystal layer forming step S150, the carrier concentration in the second crystal layer 6 is uniform in the thickness direction. Therefore, the distribution of the carrier concentration in the second crystal layer 6 after peeling can be maintained approximately uniform even if the second crystal layer 6 is warped.

Since the second crystal layer 6 is warped, the c-plane of the second crystal layer 6 will be curved in a concave spherical shape relative to the surface perpendicular to the normal direction at the center of the main surface 6s of the second crystal layer 6. The off angle formed between the normal line at the center of the main surface 6s of the second crystal layer 6 and the c-axis has a predetermined distribution.

After the temperature in the film-forming chamber 201 is sufficiently decreased, the substrate 1 and the second crystal layer 6 are unloaded out of the film-forming chamber 201.

(S170: Slicing Step)

Figure 10G:
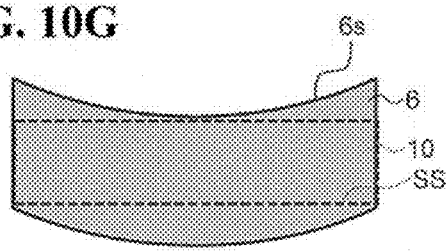

Next, as illustrated in FIG. 10G, for example, the second crystal layer 6 is sliced by guiding a wire saw along a cutting plane SS approximately perpendicular to the normal direction at the center of the main surface 6s of the second crystal layer 6.

Accordingly, the substrate 10 which is an as-sliced substrate is formed. At this time, the thickness of the substrate 10 is, for example, 450 μm.

(S180: Polishing Step)

Next, both sides of the substrate 10 is polished with a polishing apparatus.

As described above, the substrate 10 formed of the GaN-single crystal is obtained.

In the finished substrate 10, the carrier concentration ratio $N_{IR}/N_{Elec}$ satisfies, for example, formula (1). Moreover, when the above-described carrier concentration ratio $N_{IR}/N_{Elec}$ is satisfied, the mobility ratio $\mu_{IR}/\mu_{Elec}$ also satisfies, for example, formula (2) at the same time. Further, the maximum in-plane carrier concentration difference of the substrate 10 is, for example, 18% or less. A low-index crystal plane closest to the main surface 10s of the substrate 10 is a c-plane curved in a concave spherical shape relative to the main surface 10s.

(5) Effect Obtained by this Embodiment

According to this embodiment, one or more effects illustrated below may be obtained.

(a) The substrate 10 of this embodiment is configured so that the carrier concentration $N_{IR}$ and the mobility $\mu_{IR}$ on the main surface 10s side can be measured based on the reflectance of the main surface 10s measured by reflection-type FTIR method. The reason is considered that the substrate 10 manufactured by the method for manufacturing this embodiment has little crystal strain and scarcely contains O and impurities other than the conductive type impurity. As described above, since the crystal quality of the substrate 10 is good, the reflectance spectrum actually measured by the FTIR method and the intensity reflectance R obtained by the theoretical formula can be fitted each other with high accuracy, and the carrier concentration $N_{IR}$ and the mobility $\mu_{IR}$ on the main surface 10s side of the substrate 10 can be measured with high accuracy in the substrate 10.

(b) In the substrate 10 of this embodiment, the carrier concentration ratio $N_{IR}/N_{Elec}$ satisfies formula (1) ($0.5 \leq N_{IR}/N_{Elec} \leq 1.5$). The carrier concentration $N_{Elec}$ in the substrate 10 obtained by the electrical measurement is a physical property value averaged across the entire thickness direction of the substrate 10. On the other hand, the carrier concentration $N_i$ in the substrate 10 obtained based on the reflectance of the main surface measured by the reflection-type FTIR method is a physical property value which reflects only the main surface 10s side of the substrate 10. Therefore, since the carrier concentration ratio $N_{IR}/N_{Elec}$ satisfies formula (1) as described above. The difference between the carrier concentration on the center side (near the center) of the main surface 10s of the substrate 10 obtained by the reflection-type FTIR method and the carrier concentration averaged across the entire thickness direction of the substrate 10 obtained by the electrical measurement is small. In other words, the carrier concentration in the substrate 10 is approximately uniform in the thickness direction. In this embodiment, it corresponds to the carrier concentration in the substrate 10 being approximately uniform not only in the thickness direction but also in the direction along the main surface 10s, since the substrate 10 is manufactured by the VAS method. Accordingly, when a plurality of semiconductor devices are cut from the substrate 10, variation among the plurality of semiconductor devices can be suppressed.

(c) In the substrate 10 of this embodiment, the mobility ratio $\mu_{IR}/\mu_{Elec}$ satisfies formula (2) ($0.6 \leq \mu_{IR}/\mu_{Elec} \leq 1.4$). The difference between the mobility on the center side (near the center) of the main surface 10s of the substrate 10 obtained by the reflection-type FTIR method and the mobility averaged across the entire thickness direction of the substrate 10 obtained by the electrical measurement is small. In this embodiment, it corresponds to the mobility in the substrate 10 being approximately uniform not only in the thickness direction but also in the direction along the main surface 10s, since the substrate 10 is manufactured by the VAS method. Also for this reason, when a plurality of semiconductor devices are cut from the substrate 10, variation in device properties among the plurality of semiconductor devices can be suppressed.

(d) In the substrate 10 of this embodiment, the maximum in-plane carrier concentration difference obtained by $|N_{IR1}-N_{IR2}|/\text{Max}(N_{IR1}, N_{IR2}) \times 100$ is 18% or less. Therefore, when a plurality of semiconductor devices are cut from the substrate 10, the difference in device properties between a semiconductor device obtained from the center side region $10_c$ and a semiconductor device obtained from the outer peripheral side region $10_o$ may be suppressed from increasing.

(e) In this embodiment, since the substrate 10 is manufactured by the VAS method described later, the crystal strain of the substrate 10 is small, and the dislocation density in the main surface 10s of the substrate 10 is $5 \times 10^6/\text{cm}^2$ or less. Therefore, the influence of the dislocation scattering can be reduced and excessive increase or variation of the absorption coefficient can be suppressed.

(f) In this embodiment, the concentration of O in the substrate 10 is equal to or less than $\frac{1}{10}$ of the total concentration of Si and Ge in the substrate 10. Therefore, the concentration of the n-type impurity in the substrate 10 can be controlled by the total concentration of Si and Ge, whose addition amount is relatively easy to control. As a result, the free-electron concentration $N_e$ in the substrate 10 can be controlled so as to be equal to the total concentration of Si and Ge in the substrate with high accuracy.

(g) In this embodiment, the concentration of the impurity other than the n-type impurity in the substrate 10 is equal to or less than $\frac{1}{10}$ of the total concentration of Si and Ge in the substrate 10. Accordingly, an inhibiting factor against the generation of the free-electron from the n-type impurity can be reduced. As a result, the free-electron concentration $N_e$ in the substrate 10 can be controlled so as to be equal to the concentration of the n-type impurity in the substrate 10 with high accuracy.

(h) The substrate 10 manufactured by the method for manufacturing this embodiment has small crystal strain, and almost free from O and the impurity other than the n-type impurity (for example, the impurity for compensating the n-type impurity), as described above. Accordingly, in the substrate 10 of this embodiment, the absorption coefficient $\alpha$ within a wavelength range of at least 1 μm or more and 3.3 μm or less can be approximated by formula (3) ($\alpha = N_e K \lambda_a$) using the predetermined constants K and a.

For reference, in GaN-crystal manufactured by a conventional manufacturing method, it is difficult to approximate the absorption coefficient $\alpha$ by formula (3) using the above-defined constants K and a with high accuracy.

Figure 3B:
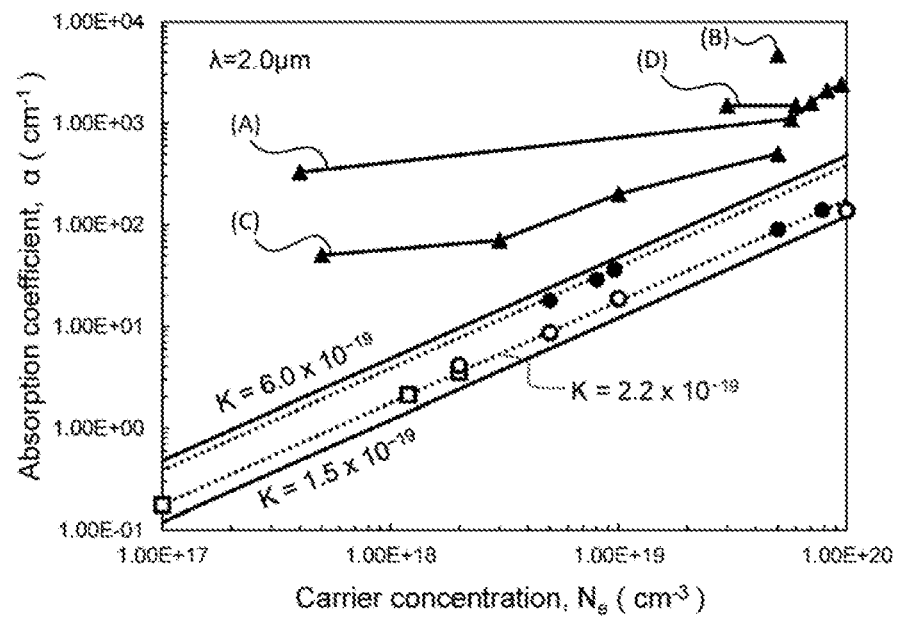
FIG. 3B is a diagram comparing a relation of an absorption coefficient at a wavelength of 2 μm to a free-electron concentration.

FIG. 3B is a diagram comparing relations of an absorption coefficient at a wavelength of 2 μm to a free-electron concentration. FIG. 3B illustrates not only the absorption coefficient of the GaN-crystal manufactured by the method for manufacturing this embodiment but also the absorption coefficients of the GaN-crystal described in articles (A) to (D).

Article (A): A. S. Barker Physical Review B 7 (1973) p 743, FIG. 8;

Article (B): P. Perlin, Physicsl Review Letter 75 (1995) p 296, predicted from the curve of 0.3 GPa in FIG. 1;

Article (C): G. Bentoumi, Materical Science Engineering B50 (1997) p 142-147, FIG. 1; and Article (D): S. Porowski, J. Crystal Growth 189-190 (1998) p. 153-158, FIG. 3 where T=12K.

As illustrated in FIG. 3B, the absorption coefficient $\alpha$ in the conventional GaN-crystal described in Articles (A) to (D) was greater than the absorption coefficient ac in the GaN-crystal manufactured by the method for manufacturing this embodiment. Moreover, a slope of the absorption coefficient $\alpha$ in the conventional GaN-crystal was different from the slope of the absorption coefficient $\alpha$ in the GaN-crystal manufactured by the method for manufacturing this embodiment. In Articles (A) and (C), the slope of the absorption coefficient $\alpha$, seems to vary with the increase of the free-electron concentration $N_e$. Accordingly, in the conventional GaN-crystals described in Articles (A) to (D), it was difficult to approximate the absorption coefficient $\alpha$ by formula (3) using the above-defined constants K and a with high accuracy. Specifically, for example, there was a possibility that the constant K is higher than the above-defined range or the constant a is a value except for 3.

It is considered to be due to the following reasons. It is considered that a conventional GaN-crystal had significant crystal strain generated therein due to its manufacturing method. When crystal strain is generated in GaN-crystal, there is increased dislocation in the GaN-crystal. Accordingly, it is considered that since dislocation scattering is generated in the conventional GaN-crystal, the absorption coefficient ca became increased or varied due to the dislocation scattering. Alternatively, it is considered that the concentration of O unintentionally incorporated in GaN-crystal manufactured by the conventional manufacturing method became higher. When O is incorporated in the GaN-crystal at high concentration, lattice constants a and c of the GaN-crystal become greater (cf. Chris G. Van de Walle, Physical Review B vol. 68, 165209 (2003)). Accordingly, it is considered that a local lattice-mismatching occurred between the portion contaminated with O and the portion of relatively high purity in the conventional GaN-crystal, and the crystal strain generated in the GaN-crystal. As a result, it is considered that the absorption coefficient $\alpha$ became increased or varied in the conventional GaN-crystal. Alternatively, in the GaN-crystal manufactured by the conventional manufacturing method, a compensating impurity which compensates the n-type impurity may be unintentionally incorporated, which seemingly results in higher compensating impurity concentration. When the concentration of the compensating impurity is high, the n-type impurity at high concentration is required to obtain a predetermined free-electron concentration. Therefore, in the conventional GaN-crystal, it is considered that the total impurity concentration including the compensating impurity and the n-type impurity became higher and the crystal strain became greater. As a result, it is considered that the absorption coefficient $\alpha$ became increased or varied in the conventional GaN-crystal. It is confirmed that a self-standing GaN substrate which actually contains O and has a distorted lattice has a higher absorption coefficient c (and a lower mobility) compared to those of the substrate 10 of this embodiment having the same free-electron concentration.

For this reason, in the conventional GaN-crystals, it was difficult to approximate the absorption coefficient $\alpha$ by formula (3) using the above-defined constants K and a with high accuracy. Thus the increased or varied absorption coefficient may lead to the excessively increased or varied extinction coefficient k. Accordingly, in conventional GaN crystal, the carrier concentration cannot be obtained with high accuracy based on the reflectance of the main surface measured by reflection-type FTIR method because of variation in the extinction coefficient k.

In contrast, the substrate 10 manufactured by the method for manufacturing this embodiment has little crystal strain and scarcely contains O and impurities other than the conductive type impurity. The absorption coefficient of the substrate 10 of this embodiment is less-affected by a scattering due to the crystal strain (dislocation scattering) but mainly depends on ionized impurity scattering. Thus variation in the absorption coefficient $\alpha$ of the substrate 10 can be reduced and the absorption coefficient $\alpha$ of the substrate 10 can be approximated by formula (3) using the predetermined constants K and a. Since the absorption coefficient of the substrate 10 is approximated by formula (3) with high accuracy, variation in the absorption coefficient $\alpha$ of the substrate 10 relative to the free-electron concentration Ne in the substrate 10 can be suppressed. Variation in the absorption coefficient $\alpha$ of the substrate 10 being suppressed indicates that variation in an extinction coefficient k is suppressed ($\alpha=4\pi k/\lambda$). Accordingly, in the substrate 10 of this embodiment, a carrier concentration $N_c$ (free-electron concentration $N_e$) and the mobility $\mu_{IR}$ can be obtained with high accuracy based on the reflectance of the main surface measured by the reflection-type FTIR method.

(i) In the second crystal layer forming step S150, the carrier concentration $N_c$ on the crystal growth surface side of the second crystal layer 6 is measured in-situ by the optical measurement, and the addition amount of the conductive type impurity is feedback controlled according to the carrier concentration $N_c$ on the crystal growth surface side. Since the carrier concentration $N_c$ on the crystal growth surface side of second crystal layer 6 is measured in real-time when the second crystal layer 6 is being growing, the addition amount of the conductive type impurity can be feedback controlled while predicting the distribution of the carrier concentration in the finished substrate 10 even when the second crystal layer 6 is being growing. Accordingly, for example, the carrier concentration in the second crystal layer 6 can be uniform in the thickness direction. In the VAS method, the second crystal layer 6 will be warped when it is peeled from the substrate 1. However, since the carrier concentration in the second crystal layer 6 is uniform in the thickness direction, the distribution of the carrier concentration in the second crystal layer 6 after peeling can be maintained approximately uniform even when the second crystal layer 6 may be warped. As a result, the carrier concentration in the substrate 10 obtained by slicing the second crystal layer 6 can be approximately uniform both in the thickness direction and the direction along the main surface 10s.

(j) In the second crystal layer forming step S150, since the carrier concentration in the second crystal layer 6 is approximately uniform in the thickness direction, the dependence of the carrier concentration in the substrate 10 on the position of slicing can be reduced when a plurality of substrates 10 are sliced from the second crystal layer 6. Thus the difference in the carrier concentration among the plurality of substrates 10 can be suppressed from occurring.

(k) In an apparatus in which the growth rate of the second crystal layer 6 gradually decreases like a HVPE apparatus 200 of this embodiment, the addition amount of the conductive type impurity is gradually decreased corresponding to the gradual decrease of the growth rate of the second crystal layer 6. Accordingly, the relative increase of the concentration of the conductive type impurity in the second crystal layer 6 resulting from the decrease of the growth rate of the second crystal layer 6 can be suppressed.

On the other hand, in an apparatus in which the growth rate of the second crystal layer 6 gradually increases, the addition amount of the conductive type impurity may be gradually increased corresponding to the gradual increase of the growth rate of the second crystal layer. Accordingly, the relative decrease of the concentration of the conductive type impurity in the second crystal layer 6 resulting from the increase of the growth rate of the second crystal layer 6 can be suppressed.

Other Embodiments

The embodiments of the present invention have been specifically explained. However, the present invention is not construed to be limited to the aforementioned embodiments, and various changes may be made without departing from the gist of the invention.

In the above-described embodiment, a case where a substrate 10 contains GaN is explained. However, the substrate 10 may contain group-III nitride not limited to GaN, but including, for example, AlN, aluminum gallium nitride (AlGaN), indium nitride (InN), indium gallium nitride (InGaN), aluminum indium gallium nitride (AlInGaN), that is, group-III nitride represented by the composition formula of $Al_xIn_yGa_{1-x-y}N$ ($0 \leq x \leq 1$, $0 \leq y \leq 1$, $0 \leq x+y \leq 1$).

In the above-described embodiment, a case is explained where the carrier concentration is slightly higher in the center side region 10c of the main surface 10s of the substrate 10 and the carrier concentration is slightly lower in the outer peripheral side region 10o surrounding the center side region 10c of the main surface 10s of the substrate 10.

However, the present invention is not limited to the case. For example, in a case where the crystal growth surface of the second crystal layer 6 gradually approaches the gas channel in the second crystal layer forming step S150, it is considered that the growth rate in the initial stage and the middle stage of the crystal growth process is relatively lower whereas the growth rate in the final stage of the crystal growth process becomes relatively higher. Therefore, in such a case, the carrier concentration in the center side region 10c of the main surface 10s of the substrate 10 may be slightly lower, whereas the carrier concentration in the outer peripheral side region 10o surrounding the center side region 10c of the main surface 10s of the substrate 10 may be slightly higher.

In the above-described embodiment, the case where the carrier concentration ratio $N_{IR}/N_{Elec}$ satisfies formula (1) and the mobility ratio $\mu_{IR}/\mu_{Elec}$ satisfies formula (2) in the substrate 10 is explained. However, it may be sufficient to establish at least one of the following: the carrier concentration ratio $N_{IR}/N_{Elec}$ satisfying formula (1) and the mobility ratio $\mu_{IR}/\mu_{Elec}$ satisfying formula (2). Accordingly, at least one of the effects of approximate uniformity of the carrier concentration and approximate uniformity of the mobility.

In the above-described embodiment, the case is explained where the carrier concentration ratio $N_{IR}/N_{Elec}$ satisfies formula (1) and the mobility ratio $\mu_{IR}/\mu_{Elec}$ satisfies formula (2) regarding the free-electron in the substrate 10 containing the n-type impurity. However, also in the substrate 10 containing the p-type impurity, the carrier concentration ratio $N_{IR}/N_{Elec}$ can satisfy formula (1) and the mobility ratio $\mu_{IR}/\mu_{Elec}$ can satisfy formula (2) regarding the hole. It should be noted that it is required to use a LO-phonon hole plasmon-coupling model in order to obtain the carrier concentration ratio $N_{IR}$ and the mobility ratio $\mu_{IR}$ regarding the hole.

In the above-described embodiment, a case is explained where the second crystal layer forming step S150 was performed using the VAS method, and the addition amount of the conductive type impurity is feedback controlled according to the carrier concentration on the crystal growth surface side of the second crystal layer 6 measured by the optical measurement in the second crystal layer forming step S150. However, the above-described feedback control may be applied using a crystal growth method other than the VAS method. However, the VAS method is more preferable in that the dislocation density can be reduced.

In the above-described embodiment, a case is explained where the carrier concentration on the crystal growth surface side of the second crystal layer 6 is measured by reflection-type FTIR method as an optical measurement, and the addition amount of the conductive type impurity is feedback controlled according to the carrier concentration on the crystal growth surface side of the second crystal layer 6 in the second crystal layer forming step S150. However, the carrier concentration on the crystal growth surface of the crystal layer may be measured by a method other than reflection-type FTIR method as an optical measurement and the above-described feedback control may be applied. Examples of a method other than reflection-type FTIR method include, for example, a spectroscopic ellipsometry method.

In the above-described embodiment, a case is explained where the addition amount of the conductive type impurity is feedback controlled according to the carrier concentration on the crystal growth surface side of the second crystal layer 6 in the second crystal layer forming step S150. However, the addition amount of the conductive type impurity may be feedback controlled according to the mobility of the second crystal layer 6 on the crystal growth surface side. At this time, for example, the above-described feedback control may be performed so that the mobility ratio $\mu_{IR}/\mu_{Elec}$ of the substrate 10 satisfies formula (2).

EXAMPLES

The results of the various kinds of experiments which support the effect of the present invention will be hereinafter explained.
(1) Manufacturing of Nitride Crystal Substrate
Under the conditions described below, samples 1 to 4 of the nitride crystal substrate were manufactured.
(Samples 1 to 3)
  Material: GaN
  Conductive type impurity: Si
  Manufacturing method: VAS method
  Feedback control of carrier concentration: Performed (uniformized in the thickness direction)
  Substrate thickness: 400 μm
  Low-index crystal plane closest to main surface: (0001) plane
(Sample 4)
  Feedback control on the carrier concentration: Not performed.
  Other conditions were similar to those for samples 1 to 3.
  The impurity concentrations were different among sample 1 to 4.
(2) Evaluation
(Measurement of Carrier Concentration by Reflection-Type FTIR Method and Mobility)
A reflectance spectrum of the main surface of the nitride crystal substrate was measured by reflection-type FTIR method. An intensity reflectance R obtained from a theoretical formula was fit to the actually measured reflectance spectrum to thereby obtain the carrier concentration $N_{IR}$ and the mobility $\mu_{IR}$ at the center of the main surface of the nitride crystal substrate. For the constants in the theoretical formula, the numerical values indicated in FIG. 7A were used.

Moreover, measurement of the reflectance spectrum by reflection-type FTIR method was performed over the entire main surface of the nitride crystal substrate, to thereby measure the distribution of the carrier concentration $N_{IR}$ in the main surface of the nitride crystal substrate. As a result, the maximum in-plane carrier concentration difference was obtained.
(Measurement of Carrier Concentration and Mobility by the Electrical Measurement)
A mobility $\mu_{Elec}$ of the nitride crystal substrate was measured by the eddy current method. A resistance (sheet resistance) of the nitride crystal substrate was measured with a stylus type resistance measuring instrument. A thickness of the nitride crystal substrate was measured with a micrometer. The specific resistance p is obtained based on the resistance of the nitride crystal substrate. The mobility $\mu_{Elec}$ of the nitride crystal substrate and specific resistance p obtained by these measurements were assigned to formula (13) to thereby obtain the carrier concentration $N_{Elec}$ of the nitride crystal substrate.
(Calculation of Carrier Concentration Ratio and Mobility Ratio)
Using the above-described measurement results, the carrier concentration ratio $N_{IR}/N_{Elec}$ and the mobility ratio $\mu_{IR}/\mu_{Elec}$ were obtained.

(3) Results

The evaluation results of samples 1 to 4 are illustrated in Table 1 below.

TABLE 1

|  | Sample 1 | Sample 2 | Sample 3 | Sample 4 |
|---|---|---|---|---|
| Feedback Control | Performed | Performed | Performed | Not Performed |
| Carrier Concentration $N_{IR}(\times 10^{18}$ cm$^{-3})$ | 3.5 | 1.4 | 2.7 | 9.0 |
| Carrier Concentration $N_{Elec}(\times 10^{18}$ cm$^{-3})$ | 3.8 | 1.4 | 2.4 | 18.5 |
| Carrier Concentration Ratio $N_{IR}/N_{Elec}$ | 0.93 | 1.04 | 1.09 | 0.49 |
| Maximum In-plane Carrier Concentration Difference (%) | 3.76 | 5.42 | 4.11 | 18.74 |
| Mobility $\mu_{IR}$ (cm$^2$/V · s) | 191.3 | 291.5 | 209.8 | 122.2 |
| Mobility $\mu_{Elec}$ (cm$^2$/V · s) | 223.6 | 312.6 | 266.6 | 209.6 |
| Mobility Ratio $\mu_{IR}/\mu_{Elec}$ | 0.86 | 0.93 | 0.79 | 0.58 |

Figure 15A:
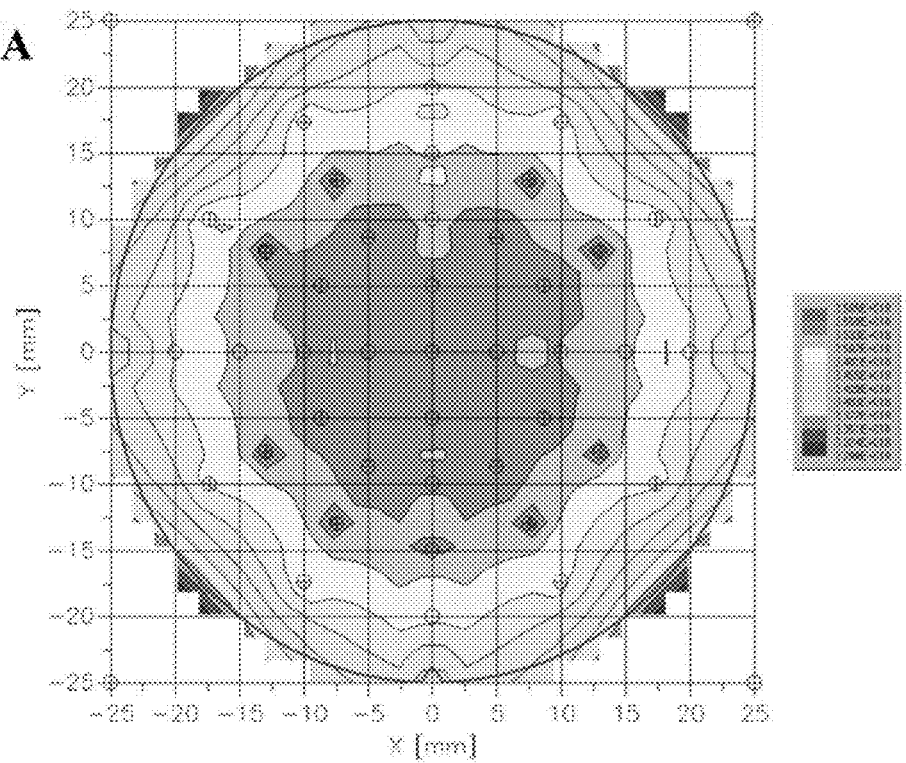
FIG. 15A is a diagram illustrating a carrier concentration distribution of sample 1.
Figure 15B:
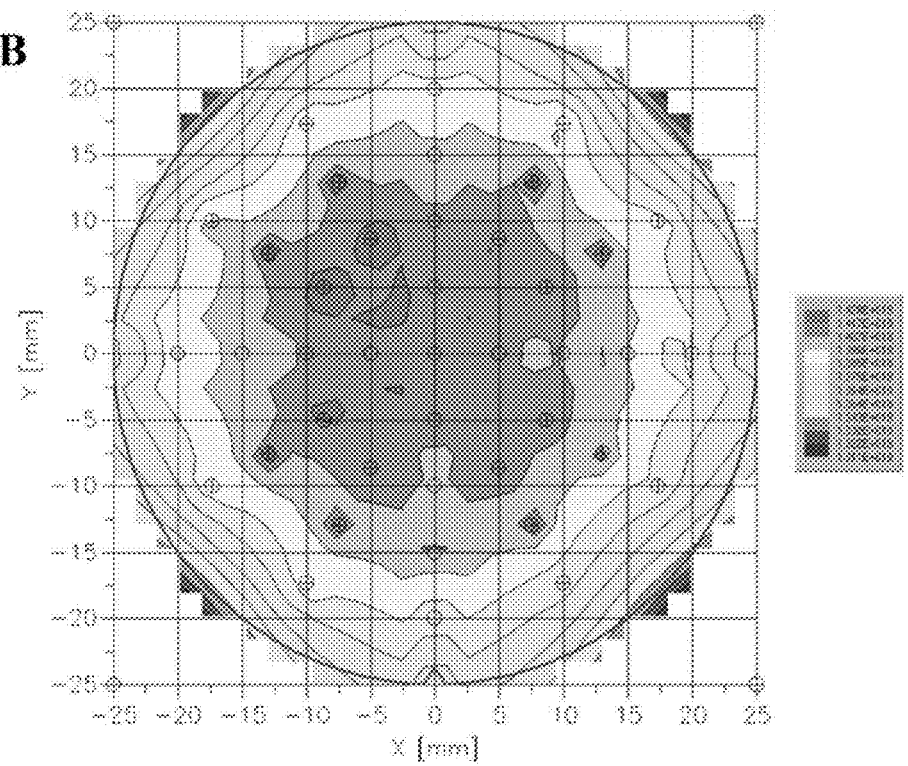
FIG. 15B is a diagram illustrating a carrier concentration distribution of sample
Figure 16A:
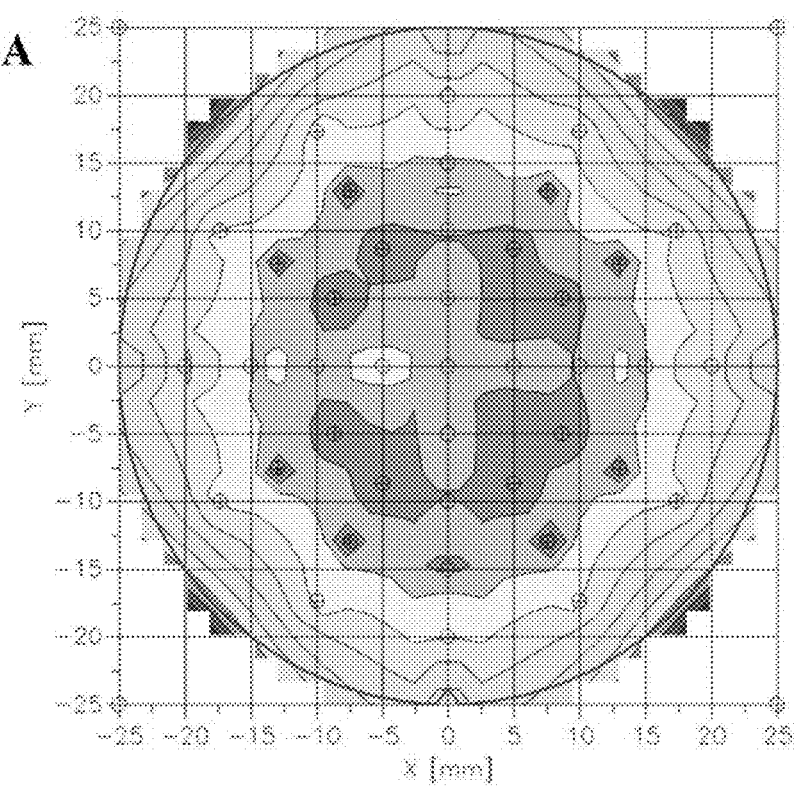
FIG. 16A is a diagram illustrating a carrier concentration distribution of sample 3.
Figure 16B:
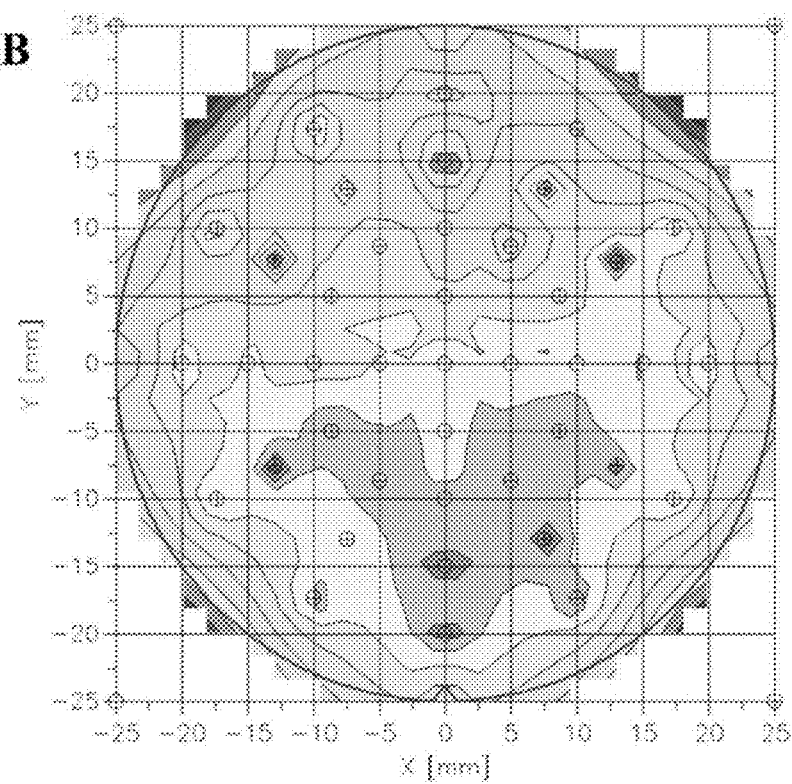
FIG. 16B is a diagram illustrating a carrier concentration distribution of sample 4.

FIG. 15A is a diagram illustrating the distribution of the carrier concentration of sample 1 and FIG. 15B is a diagram illustrating the distribution of the carrier concentration of sample 2. FIG. 16A is a diagram illustrating a carrier concentration distribution of sample 3 and FIG. 16B is a diagram illustrating a carrier concentration distribution of sample 4. In FIG. 15A to FIG. 16B, the maximum values indicated in red and the minimum values indicated in blue are respectively different.

(Sample 4)

In sample 4 which had not been feedback controlled, the carrier concentration ratio $N_{IR}/N_{Elec}$ was less than 0.5, and the mobility ratio $\mu_{IR}/\mu_{Elec}$ was less than 0.6. In sample 4, it is considered that the Si concentration in the second crystal layer becomes to have a distribution varying gradationally in the thickness direction since feedback control was not performed on the carrier concentration in the second crystal layer in a second crystal layer forming step. As a result, it is considered that the carrier concentration in the nitride crystal substrate obtained from the second crystal layer was non-uniform in the thickness direction.

As illustrated in FIG. 16B, in sample 4, the carrier concentration $N_{IR}$ on the main surface side of the crystal substrate had an approximately concentric distribution although the maximum value thereof was off center. In sample 4, there was a great difference between the maximum value and the minimum value in the carrier concentration NR, and the carrier concentration $N_{IR}$ was non-uniform in the direction along the main surface. Accordingly, the maximum in-plane carrier concentration difference was more than 18%. It is considered that, in sample 4, the impurity concentration distribution varying gradationally in the thickness direction in the second crystal layer was warped in the peeling step, and therefore the carrier concentration in the nitride crystal substrate obtained from the second crystal layer became non-uniform in the direction along the main surface.

(Samples 1 to 3)

In samples 1 to 3 which were feedback controlled, the carrier concentration ratio, $N_{IR}/N_{Elec}$ satisfied formula (1) (0.5 or more and 1.5 or less) as well as formula (1)' (0.8 or more and 1.2 or less) which was a preferred range. Further, the mobility ratio $\mu_{IR}/\mu_{Elec}$ satisfied formula (2) (0.6 or more and 1.4 or less) as well as formula (2)' (0.7 or more and 1.1 or less) which was a preferred range. In samples 1 to 3, since feedback control of the carrier concentration in the second crystal layer was performed in the formation of the second crystal layer, the concentration of Si in the second crystal layer was able to be approximately uniform in the thickness direction. It was confirmed that the carrier concentration in the nitride crystal substrate obtained from the second crystal layer was consequently able to be approximately uniform in the thickness direction.

As illustrated in FIG. 15A, FIG. 15B, and FIG. 16A, in samples 1 to 3, the carrier concentration $N_{IR}$ on the main surface side of the nitride crystal substrate had an approximately concentric distribution. In samples 1 to 3, however, the difference between the maximum value and the minimum value in the carrier concentration $N_{IR}$ is small, and the carrier concentration $N_{IR}$ was approximately uniform in the direction along the main surface. Accordingly, the maximum in-plane carrier concentration difference was 18% or less, the preferred range thereof being 6% or less. In samples 1 to 3, since the carrier concentration in the second crystal layer was feedback controlled to be uniform in the thickness direction, the distribution of the carrier concentration in the second crystal layer after peeling was able to be kept approximately uniform even when the second crystal layer was warped in the peeling step. It was confirmed that the carrier concentration in the nitride crystal substrate obtained from the second crystal layer was consequently able to be approximately uniform in the direction along the main surface.

<Preferred Aspect of the Present Invention>

Hereinafter, supplementary descriptions of the preferred aspects of the present invention will be given.

(Supplementary Description 1)

There is provided a nitride crystal substrate having a main surface and formed of group-III nitride crystal, wherein $N_{IR}/N_{Elec}$ satisfies formula (1) below, which is a ratio of a carrier concentration $N_{IR}$ at a center of the main surface to a carrier concentration $N_{Elec}$:

$$0.5 \leq N_{IR}/N_{Elec} \leq 1.5 \tag{1}$$

where, $N_{IR}$ is the carrier concentration on the main surface side of the nitride crystal substrate obtained based on a reflectance of the main surface measured by a reflection type Fourier transform infrared spectroscopy, and $N_{Elec}$ is the carrier concentration in the nitride crystal substrate obtained based on a specific resistance of the nitride crystal substrate and a mobility of the nitride crystal substrate measured by an eddy current method.

(Supplementary Description 2)

There is provided the nitride crystal substrate according to supplementary description 1, wherein the ratio $N_{IR}/N_{Elec}$ Satisfies formula (1'):

$$0.8 \leq N_{IR}/N_{Elec} \leq 1.2 \tag{1'}$$

(Supplementary Description 3)

There is provided the nitride crystal substrate according to supplementary description 1 or 2 comprising:

a center side region that is a center side of the main surface of the nitride substrate and has a first carrier concentration $N_{IR1}$, which is an extreme value of the carrier concentration $N_{IR}$ obtained by the reflection-type Fourier-transform infrared spectroscopy, and an outer peripheral side region that surrounds the center side region at a radial position of 20 mm or less from the center of the main surface of the nitride crystal substrate and has a second carrier concentration $N_{IR2}$, which is an extreme value opposite to the first carrier concentration $N_{IR1}$, wherein a maximum in-plane carrier concentration difference obtained by the following formula is 18% or less:

$$|N_{IR1} - N_{IR2}|/\text{Max}(N_{IR1}, N_{IR2}) \times 100$$

where Max($N_{IR1}$,$N_{IR2}$) is the larger of the first carrier concentration $N_{IR1}$ and the second carrier concentration $N_{IR2}$.

(Supplementary Description 4)

There is provided the nitride crystal substrate according to supplementary description 3, wherein the maximum in-plane carrier concentration difference is 6% or less.

(Supplementary Description 5)

There is provided the nitride crystal substrate according to any one of supplementary descriptions 1 to 4, wherein $\mu_{IR}/\mu_{Elec}$ satisfies formula (2) below, which is a ratio of a mobility $\mu_{IR}$ at the center of the main surface relative to a mobility $\mu_{Elec}$:

$$0.6 \leq \mu_{IR}/\mu_{Elec} \leq 1.4 \quad (2)$$

where $\mu_{IR}$ is the mobility on the main surface side of the nitride crystal substrate obtained based on the reflectance of the main surface measured by the reflection-type Fourier-transform infrared spectroscopy and $\mu_{Elec}$ is the mobility of the nitride crystal substrate measured by the eddy current method.

(Supplementary Description 6)

There is provided a nitride crystal substrate having a main surface and formed of group-III nitride crystal, wherein $\mu_{IR}/\mu_{Elec}$ satisfies formula (2) below, which is a ratio of a mobility $\mu_{IR}$ at the center of the main surface relative to a mobility $\mu_{Elec}$:

$$0.6 \leq \mu_{IR}/\mu_{Elec} \leq 1.4 \quad (2)$$

where $\mu_{IR}$ is the mobility on the main surface side of the nitride crystal substrate obtained based on a reflectance of the main surface measured by the reflection-type Fourier-transform infrared spectroscopy, and $\mu_{Elec}$ is the mobility of the nitride crystal substrate measured by the eddy current method.

(Supplementary Description 7)

There is provided the nitride crystal substrate according to supplementary description 5 or 6, wherein the ratio $\mu_{IR}/\mu_{Elec}$ satisfies formula (2'):

$$0.7 \leq \mu_{IR}/\mu_{Elec} \leq 1.1 \quad (2').$$

(Supplementary Description 8)

There is provided the nitride crystal substrate according to any one of supplementary descriptions 1 to 7, wherein the dislocation density in the main surface of the nitride crystal substrate is $5 \times 10^6/cm^2$ or less.

(Supplementary Description 9)

There is provided the nitride crystal substrate according to any one of supplementary descriptions 1 to 8 containing at least one of silicon and germanium, wherein the concentration of oxygen in the nitride crystal substrate is equal to or less than 1/10 of a total concentration of silicon and germanium in the nitride crystal substrate.

(Supplementary Description 10)

There is provided the nitride crystal substrate according to any one of supplementary descriptions 1 to 9 containing at least one of silicon and germanium, wherein the concentration of the impurity other than the n-type impurity in the nitride crystal substrate is equal to or less than 1/10 of the total concentration of silicon and germanium in the nitride crystal substrate.

(Supplementary Description 11)

There is provided the nitride crystal substrate according to any one of supplementary descriptions 1 to 10, wherein the nitride crystal substrate contains the n-type impurity, and an absorption coefficient ac in the wavelength range of at least 1 μm or more and 3.3 μm or less is approximated by formula (3) according to the least-squares method, an error of the measured absorption coefficient relative to the absorption coefficient α obtained from formula (3) is within ±0.1α at the wavelength of 2 μm:

$$\alpha = N_e \lambda^a \quad (3)$$

(in the formula,

λ (μm) is a wavelength,

α ($cm^{-3}$) is the absorption coefficient of the nitride crystal substrate at 27° C., $N_e$ ($cm^{-3}$) is a free-electron concentration in the nitride crystal substrate obtained based on a specific resistance of the crystal substrate and a mobility measured by an eddy current method, and K and a are constant; where $1.5 \times 10^{-19} \leq K \leq 6.0 \times 10^{-19}$, a=3).

(Supplementary Description 12)

There is provided the nitride crystal substrate according to supplementary description 11, wherein no crack is generated.

(Supplementary Description 13)

There is provided the nitride crystal substrate according to any one of supplementary descriptions 1 to 12, wherein a low-index crystal plane closest to the main surface is a (0001) plane curved in a concave spherical shape relative to the main surface.

(Supplementary Description 14)

There is provided the nitride crystal substrate according to supplementary, description 13, wherein an off angle of a <0001> axis of the crystal relative to a normal line of the main surface is approximated by a linear formula of a distance from the center of the main surface toward a radial direction, an error of the measured off angle relative to the off angle obtained from the linear formula is within ±0.12°, at an arbitrary position in the main surface.

(Supplementary Description 15)

There is provided a method for manufacturing a nitride crystal substrate comprising:

forming a crystal layer formed of group-III nitride crystal containing a predetermined conductive type impurity on a base substrate; and slicing the crystal layer to fabricate the nitride crystal substrate;

wherein, in the formation of the crystal layer, a carrier concentration on a crystal growth surface side of the crystal layer is measured by an optical measurement, and an addition amount of the conductive type impurity is feedback controlled according to the carrier concentration on the crystal growth surface side.

(Supplementary Description 16)

There is provided the method for manufacturing the nitride crystal substrate according to supplementary description 15, wherein, in the formation of the crystal layer, the addition amount of the conductive type impurity is feedback controlled according to the carrier concentration on the crystal growth surface side so that $N_{IR}/N_{Elec}$ satisfies formula (1) below, which is a ratio of a carrier concentration $N_{IR}$ at the center of the main surface to a carrier concentration $N_{Elec}$:

$$0.5 \leq N_{IR}/N_{Elec} \leq 1.5 \quad (1)$$

where $N_{IR}$ is the carrier concentration on a main surface side of the nitride crystal substrate obtained based on a reflectance of the main surface of the nitride crystal substrate measured by the reflection-type Fourier-transform infrared spectroscopy, and $N_{Elec}$ is the carrier concentration in the nitride crystal substrate obtained based on a specific resistance of the nitride crystal substrate and a mobility of the nitride crystal substrate measured by the eddy current method.

(Supplementary Description 17)

There is provided a method for manufacturing a nitride crystal substrate comprising:

forming a crystal layer formed of group-III nitride crystal containing a predetermined conductive type impurity on a base substrate; and slicing the crystal layer to fabricate the nitride crystal substrate;

wherein, in the formation of the crystal layer, a mobility on a crystal growth surface side of the crystal layer is measured by an optical measurement, and an addition amount of the conductive type impurity is feedback controlled according to the mobility on the crystal growth surface side.

(Supplementary Description 18)

There is provided the method for manufacturing the nitride crystal substrate according to supplementary description 17, wherein, in the formation of the crystal layer, the addition amount of the conductive type impurity is feedback controlled according to the mobility on the crystal growth surface side so that $\mu_{IR}/\mu_{Elec}$ satisfies formula (2) below, which is a ratio of a mobility $\mu_{IR}$ at the center of the main surface relative to a mobility $\mu_{Elec}$:

$$0.6 \leq \mu_{IR}/\mu_{Elec} \leq 1.4 \qquad (2)$$

where $\mu_{IR}$ is the mobility on a main surface side of the nitride crystal substrate obtained based on a reflectance of the main surface of the nitride crystal substrate measured by the reflection-type Fourier-transform infrared spectroscopy and $\mu_{Elec}$ is the mobility of the nitride crystal substrate measured by the eddy current method.

(Supplementary Description 19)

There is provided the method for manufacturing the nitride crystal according to any one of supplementary descriptions 15 to 18, wherein, in the formation of the crystal layer, the addition amount of the conductive type impurity is gradually decreased corresponding to a gradual decrease of a growth rate of the crystal layer.

(Supplementary Description 20)

The method for manufacturing the nitride crystal substrate according to any one of Supplementary descriptions 15 to 18, wherein, in the formation of the crystal layer, the addition amount of the conductive type impurity is gradually increased corresponding to a gradual increase of a growth rate of the crystal layer.

(Supplementary Description 21)

There is provided the method for manufacturing the nitride crystal according to any one of supplementary descriptions 15 to 20, wherein, in the formation of the crystal layer, a member at least a surface of which is formed of a quartz-free and boron-free material is used as a member constituting a high temperature region in a reaction container to which the base substrate is loaded, the high temperature region being heated to a predetermined crystal growth together with the base substrate and being the region in contact with a film-forming gas to be supplied to the base substrate.

(Supplementary Description 22)

There is provided the method for manufacturing a nitride crystal substrate according to supplementary description 21, wherein a member containing silicon carbide-coated graphite is used as a member constituting the high temperature region.

(Supplementary Description 23)

There is provided a method for manufacturing a crystal substrate comprising:

forming a crystal layer formed of a semiconductor crystal containing a predetermined conductive type impurity on a base substrate; and slicing the crystal layer to fabricate the semiconductor crystal substrate;

wherein, in the formation of the crystal layer, a carrier concentration on a crystal growth surface side of the crystal layer is measured by an optical measurement, and an addition amount of the conductive type impurity is feedback controlled according to the carrier concentration on the crystal growth surface side.

(Supplementary Description 24)

There is provided a method for manufacturing a crystal substrate comprising:

forming a crystal layer formed of semiconductor crystal containing a predetermined conductive type impurity on a base substrate; and slicing the crystal layer to fabricate the nitride crystal substrate;

wherein, in the formation of the crystal layer, a mobility on a crystal growth surface side of the crystal layer is measured by an optical measurement, and an addition amount of the conductive type impurity is feedback controlled according to the mobility on the crystal growth surface side.

DESCRIPTIONS OF SIGNS AND NUMERALS

1 Base substrate (Substrate)
2 First crystal layer
3 Metal layer
4 Void-containing first crystal layer
5 Metal nitride layer
6 Second crystal layer
10 Nitride crystal substrate (Substrate)

What is claimed is:

1. A nitride crystal substrate having a main surface and formed of group-III nitride crystal, wherein $N_{IR}/N_{Elec}$ satisfies formula (1) below, which is a ratio of a carrier concentration $N_{IR}$ at a center of the main surface to a carrier concentration $N_{Elec}$:

$$0.5 \leq N_{IR}/N_{Elec} \leq 1.5 \qquad (1)$$

where $N_{IR}$ is the carrier concentration on the main surface side of the nitride crystal substrate obtained based on a reflectance of the main surface measured by a reflection type Fourier transform infrared spectroscopy, and $N_{Elec}$ is the carrier concentration averaged across an entire thickness direction of the nitride crystal substrate obtained based on a specific resistance of the nitride crystal substrate and a mobility of the nitride crystal substrate measured by an eddy current method.

2. The nitride crystal substrate according to claim 1, wherein the ratio $N_{IR}/N_{Elec}$ satisfies formula (1'):

$$0.8 \leq N_{IR}/N_{Elec} \leq 1.2 \tag{1'}$$

3. The nitride crystal substrate according to claim 1 comprising:
   a center side region that is a center side of the main surface of the nitride crystal substrate and has a first carrier concentration $N_{IR1}$ which is an extreme value of the carrier concentration $N_{IR}$ obtained by the reflection-type Fourier-transform infrared spectroscopy, and
   an outer peripheral side region that surrounds the center side region at a radial position of 20 mm or less from the center of the main surface of the nitride crystal substrate and has a second carrier concentration $N_{IR2}$ which is an extreme value opposite to the first carrier concentration $N_{IR1}$,
   wherein a maximum in-plane carrier concentration difference obtained by the following formula is 18% or less:

$$|N_{IR1}-N_{IR2}|/\text{Max}(N_{IR1},N_{IR2}) \times 100$$

where $\text{Max}(N_{IR1},N_{IR2})$ is the larger of the first carrier concentration $N_{IR1}$ and the second carrier concentration $N_{IR2}$.

4. The nitride crystal substrate according to claim 1, wherein $\mu_{IR}/\mu_{Elec}$, satisfies formula (2) below, which is a ratio of a mobility $\mu_{IR}$ at the center of the main surface relative to a mobility $\mu_{Elec}$:

$$0.6 \leq \mu_{IR}/\mu_{Elec} \leq 1.4 \tag{2}$$

where $\mu_{IR}$ is the mobility on the main surface side of the nitride crystal substrate obtained based on a reflectance of the main surface measured by the reflection-type Fourier-transform infrared spectroscopy, and
$\mu_{Elec}$ is the mobility averaged across an entire thickness direction of the nitride crystal substrate measured by the eddy current method.

5. A nitride crystal substrate having a main surface and formed of group-III nitride crystal,
wherein $\mu_{IR}/\mu_{Elec}$, satisfies formula (2) below, which is a ratio of a mobility $\mu_{IR}$ at the center of the main surface relative to a mobility $\mu_{Elec}$:

$$0.6 \leq \mu_{IR}/\mu_{Elec} \leq 1.4 \tag{2}$$

where $\mu_{IR}$ is the mobility on the main surface side of the nitride crystal substrate obtained a reflectance of the main surface measured by the reflection-type Fourier-transform infrared spectroscopy, and
$\mu_{Elec}$ is the mobility averaged across an entire thickness direction of the nitride crystal substrate measured by the eddy current method.

6. The nitride crystal substrate according to claim 4, wherein the ratio $\mu_{IR}/\mu_{Elec}$ satisfies formula (2'):

$$0.7 \leq \mu_{IR}/\mu_{Elec} \leq 1.1 \tag{2'}$$

7. The nitride crystal substrate according to claim 1, wherein the dislocation density in the main surface of the nitride crystal substrate is $5 \times 10^6/\text{cm}^2$ or less.

8. The nitride crystal substrate according to claim 1 containing at least one of silicon and germanium,
wherein the concentration of oxygen in the nitride crystal substrate is equal to or less than $\frac{1}{10}$ of the total concentration of silicon and germanium in the nitride crystal substrate.

9. The nitride crystal substrate according to claim 1 containing at least one of silicon and germanium,
wherein the concentration of the impurity other than the n-type impurity in the nitride crystal substrate is equal to or less than $\frac{1}{10}$ of the total concentration of silicon and germanium in the nitride crystal substrate.

10. The nitride crystal substrate according to claim 1,
wherein the nitride crystal substrate contains the n-type impurity, and
an absorption coefficient α in the wavelength range of at least 1 μm or more and 3.3 μm or less is approximated by formula (3) according to the least-squares method, and
an error of the measured absorption coefficient relative to the absorption coefficient α obtained from formula (3) is within ±0.1a at the wavelength of 2 μm:

$$\alpha = N_e K \lambda^a \tag{3}$$

(in the formula,
λ (μm) is a wavelength,
α (cm$^{-1}$) is the absorption coefficient of the nitride crystal substrate at 27° C.,
$N_e$ (cm$^{-3}$) is a free-electron concentration in the nitride crystal substrate obtained based on a specific resistance of the crystal substrate and a mobility measured by an eddy current method, and
K and a are constant; where $1.5 \times 10^{-19} \leq K \leq 6.0 \times 10^{-19}$, a=3).

11. A nitride crystal substrate having a main surface and formed of group-III nitride crystal,
wherein $N_{IR}/N_{Elec}$ satisfies formula (1) below, which is a ratio of a carrier concentration $N_{IR}$ at a center of the main surface to a carrier concentration $N_{Elec}$:

$$0.5 \leq N_{IR}/N_{Elec} \leq 1.5 \tag{1}$$

where $N_{IR}$ is the carrier concentration on the main surface side of the nitride crystal substrate obtained based on a reflectance of the main surface measured by a reflection type Fourier transform infrared spectroscopy, and
$N_{Elec}$ is the carrier concentration in the nitride crystal substrate obtained based on a specific resistance of the nitride crystal substrate and a mobility of the nitride crystal substrate measured by an eddy current method,
wherein the nitride crystal substrate contains the n-type impurity, and
an absorption coefficient α in the wavelength range of at least 1 μm or more and 3.3 μm or less is approximated by formula (3) according to the least-squares method, and
an error of the measured absorption coefficient relative to the absorption coefficient α obtained from formula (3) is within ±0.1a at the wavelength of 2 μm:

$$\alpha = N_e K \lambda^a \tag{3}$$

(in the formula,
(μm) is a wavelength,
α (cm$^{-1}$) is the absorption coefficient of the nitride crystal substrate at 27° C.,
$N_e$ (cm$^{-3}$) is a free-electron concentration in the nitride crystal substrate obtained based on a specific resistance of the crystal substrate and a mobility measured by an eddy current method, and
K and a are constant; where $1.5 \times 10^{-19} \leq K \leq 6.0 \times 10^{-19}$, a=3).

12. The nitride crystal substrate according to claim 1, where $N_{IR}$ is obtained by fitting an intensity reflectance obtained from theoretical formula to an intensity reflectance of the main surface measured by the reflection type Fourier transform infrared spectroscopy.

13. The nitride crystal substrate according to claim 5, where $\mu_{IR}$ is obtained by fitting an intensity reflectance obtained from theoretical formula to an intensity reflectance of the main surface measured by the reflection type Fourier transform infrared spectroscopy.

* * * * *